US005602405A

United States Patent [19]
Terasawa

[11] Patent Number: 5,602,405
[45] Date of Patent: Feb. 11, 1997

[54] SEMICONDUCTOR DEVICE WITH BASE FORMED BY THE JUNCTION OF TWO SEMICONDUCTORS OF THE SAME CONDUCTIVE TYPE

[75] Inventor: Yoshio Terasawa, Hitachinaka, Japan

[73] Assignee: NGK Insulators, Ltd., Nagoya, Japan

[21] Appl. No.: 468,823

[22] Filed: Jun. 6, 1995

[30] Foreign Application Priority Data

Sep. 5, 1994 [JP] Japan .................................... 6-211008

[51] Int. Cl.$^6$ ............................ H01L 29/74; H01L 31/111
[52] U.S. Cl. ......................... 257/136; 257/152; 257/153; 257/264; 257/266; 257/287
[58] Field of Search .................................... 257/136, 152, 257/153, 264, 266, 287

[56] References Cited

U.S. PATENT DOCUMENTS

| | | |
|---|---|---|
| 4,198,645 | 4/1980 | Nishizawa . |
| 4,341,011 | 7/1982 | Okano et al. . |
| 4,587,712 | 5/1986 | Bolign . |
| 4,654,679 | 3/1987 | Muraoka . |
| 4,829,348 | 5/1989 | Broich et al. . |
| 4,835,586 | 5/1989 | Cogan et al. . |
| 4,872,044 | 10/1989 | Nishizawa et al. . |
| 5,298,787 | 3/1994 | Bozler et al. ........................... 257/592 |

FOREIGN PATENT DOCUMENTS

| | | |
|---|---|---|
| 0425037A2 | 5/1991 | European Pat. Off. . |
| 0663698A1 | 7/1995 | European Pat. Off. . |
| 28-6077 | 11/1953 | Japan . |
| 57-9226 | 2/1982 | Japan . |
| 59-17547 | 4/1984 | Japan . |
| 60-5064 | 2/1985 | Japan . |
| 1-26187 | 5/1989 | Japan . |
| 1467354 | 3/1977 | United Kingdom . |
| 95/04375 | 2/1995 | WIPO . |

OTHER PUBLICATIONS

A. Fukuroda et al., "Si Wafer Bonding with Ta Silicide Formation", 30 *Japan J. Applied Physics* 1693–1695 (Oct. 1991).

J. Nishizawa, "High–power vertical joint FET with triode characteristics", Nikkei Electronics, vol. 1971, 9, 27, pp. 50–61 (with partial translation).

J. Nishizawa et al., "Field–Effect Transistor Versus Analog Transistor (Static Induction Transistor)", IEEE Trans. on Electron Devices, vol. ED–22 No. 4, Apr. 1975, pp. 185–197.

(List continued on next page.)

*Primary Examiner*—Ngân V. Ngô
*Attorney, Agent, or Firm*—Ronald J. Kubovcik; Peter B. Martine

[57] ABSTRACT

A semiconductor device, by which a base in which gates are buried can be formed by the junction of semiconductor substrates to each other at a lower temperature, and a fabrication process thereof are provided. Recesses are defined in the top of an N$^-$ substrate. A P$^+$ layer is formed on the underside of the N$^-$ substrate. P$^+$-Gate regions are each formed in an area ranging from the bottom to lower side portions of the recesses. A metal layer composed of an Au-Sb alloy is formed on the underside of the N$^+$ substrate. The N$^-$ substrate and the N$^+$ substrate are subjected to a treatment for removing impurities thereon with an aqueous solution of sulfuric acid and hydrogen peroxide, washed with purified water and dried by a spin dryer. The N$^-$ substrate and the N$^+$ substrate are heated at about 350° C. in a hydrogen atmosphere in a state that the tops of projections between the recesses have been brought into contact with the metal layer provided on the underside of the N$^+$ substrate, whereby the N$^-$ substrate and the N$^+$ substrate are joined to each other.

7 Claims, 19 Drawing Sheets

OTHER PUBLICATIONS

J. Nishizawa et al. "Static Induction Thyristor", Rev. de Physiquee Appliquee, TOME 13, Dec. 78, pp. 725–728.

J. Nishizawa et al., "Effects of Gate Structure on Static Induction Thyristor", Tech. Dig. 1980 IEDM, 1980, pp. 658–661.

"Analysis of Characteristic of Static Induction Thyristor", Technical Research Report, Electronics Comm. Soc., ED81–84 (1981), pp. 31–38 (with partial translation).

"Static Induction Thyristor", Technical Research Report, Electronics Comm. Soc, ED81–7 (1981) pp. 49–55 (with partial translation).

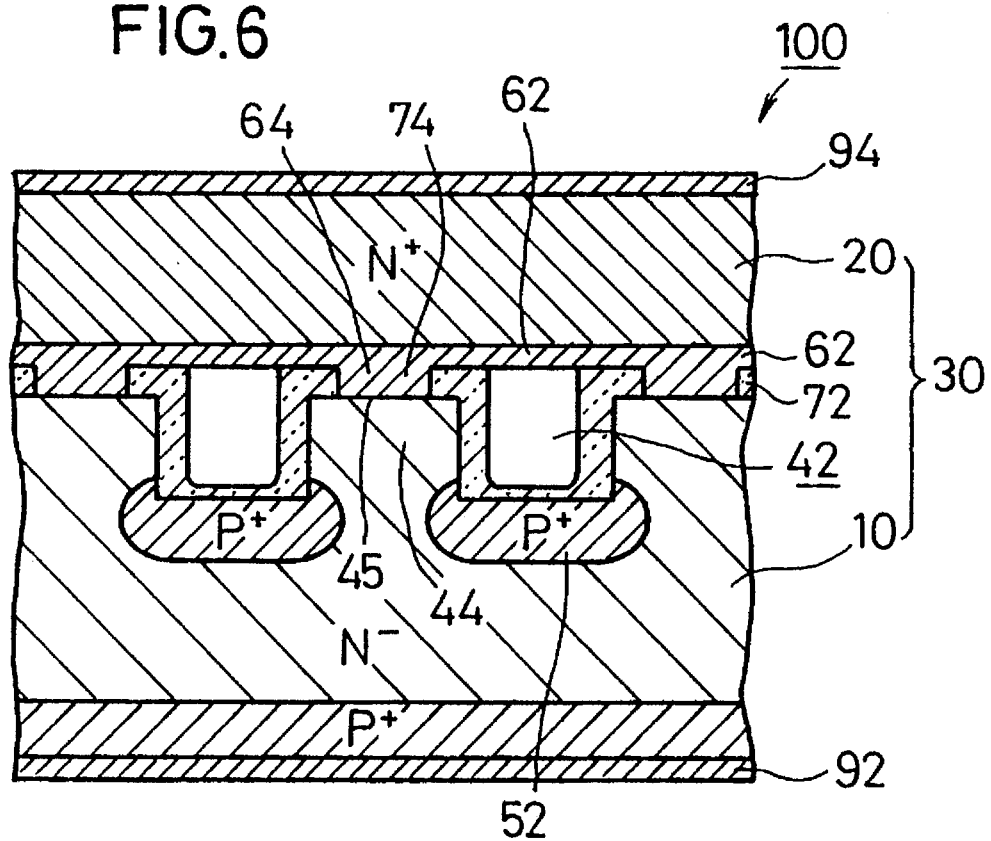

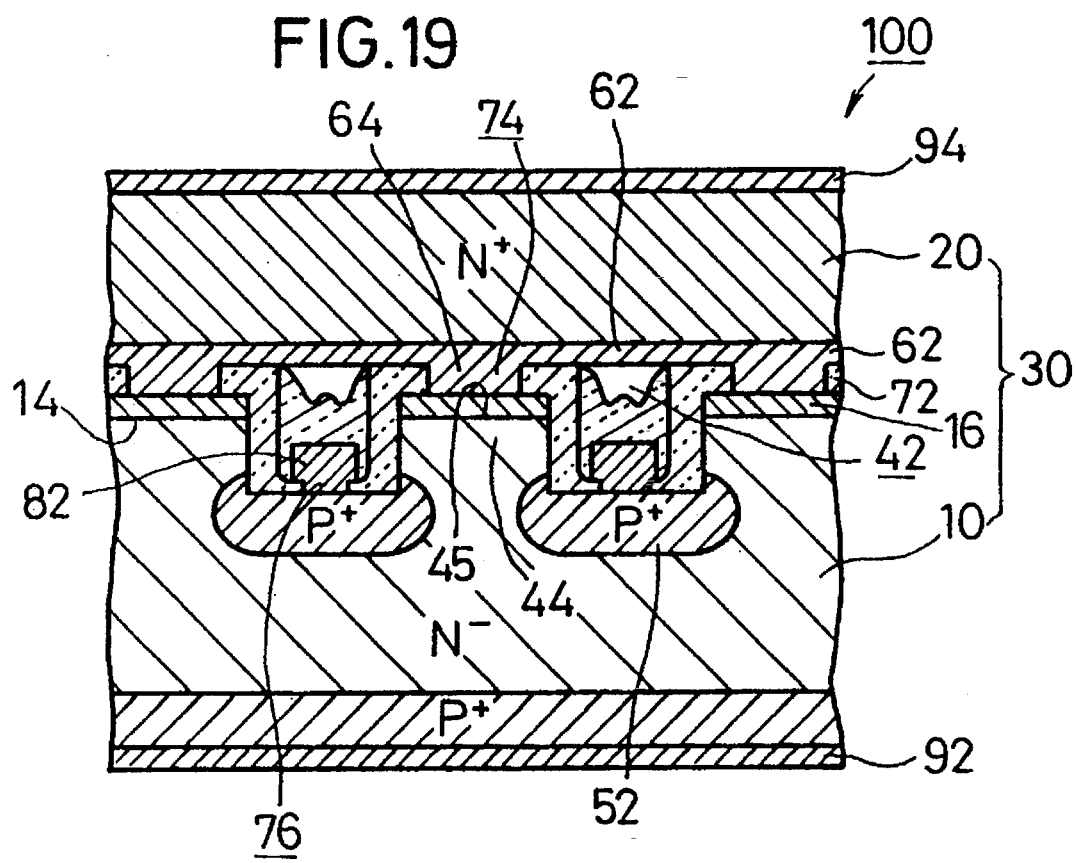

SEMICONDUCTOR DEVICE WITH BASE FORMED BY THE JUNCTION OF TWO SEMICONDUCTORS OF THE SAME CONDUCTIVE TYPE

BACKGROUND OF THE INVENTION

1. Field of the Invention

The present invention relates to a semiconductor device and a fabrication process thereof, and particularly to a static induction (SI) thyristor and a fabrication process thereof.

2. Description of the Related Art

FIGS. 1A and 1B are cross-sectional views illustrating a conventional static induction thyristor and a fabrication process thereof, which were proposed by the present inventor.

This type static induction thyristor 100 was conventionally fabricated in the following manner.

As illustrated in FIG. 1A, an $N^-$ substrate 10 and an $N^+$ substrate 20, which have been subjected to mirror polishing on at least sides to be joined to each other, are first provided.

A plurality of recesses 42 is then defined in the top 14 of the $N^-$ substrate 10 by a photolithography process. Thus, projections 44 are defined between the recesses 42.

A $P^+$ layer 12 is then formed on the underside of the $N^-$ substrate 10 by an impurity-diffusing process.

Further, boron, which is a P-type impurity, is selectively diffused from the top side of the $N^-$ substrate 10 therein, whereby $P^+$-gate regions 52 are each formed in the whole exposed surface ranging from the bottom 43 to lower side portions of the recesses 42 defined in the $N^-$ substrate 10.

Thereafter, the $N^-$ substrate 10 and the $N^+$ substrate 20 are subjected to ultrasonic cleaning with an aqueous solution of sulfuric acid and hydrogen peroxide to remove organic substances and metals on the substrates.

The $N^-$ substrate 10 and the $N^+$ substrate 20 are then washed with purified water and dried by a spin dryer at room temperature.

The $N^-$ substrate 10 and the $N^+$ substrate 20 are then heated at about 400°–1000° C. in a hydrogen atmosphere in a state that the tops 45 of the projections 44 between the recesses 42 of the $N^-$ substrate 10 have been brought into contact with the underside of the $N^+$ substrate 20 as illustrated in FIG. 1B, whereby the $N^-$ substrate 10 and the $N^+$ substrate 20 are joined to each other.

Further, an anode electrode 92 and a cathode electrode 94 are formed on the underside of the $P^+$ layer 12 formed on the underside of the $N^-$ substrate 10 and the top of the $N^+$ substrate 20, respectively.

In the static induction thyristor 100 thus fabricated, the $P^+$ layer 12 functions as an anode, while the $N^+$ substrate 20 functions as a cathode. The $N^-$ substrate 10 functions as an N base. The $P^+$-gate regions 52 function as a gate which controls an anode current flowing between the anode electrode 92 and the cathode electrode 94.

SUMMARY OF THE INVENTION

In the conventional static induction thyristor 100, the N base in which the $P^+$-gate regions 52 are buried is formed by the junction of the $N^-$ substrate 10 and the $N^+$ substrate 20. Therefore, the N base 30 can be provided as a crystalline base uniform and high in quality. The $P^+$-gate regions 52 may also be made high in concentration, and the maximum cut-off current may hence be heightened.

As described above, the conventional static induction thyristor and the fabrication process thereof, which were proposed by the present inventor, have the excellent features. However, the fabrication of this conventional static induction thyristor 100 involved a problem that since the $N^-$ substrate 10 and the $N^+$ substrate 20 are heated at about 400°–1000° C. in a hydrogen atmosphere in a state that the tops 45 of the projections 44 between the recesses 42 of the $N^-$ substrate 10 have been brought into contact with the underside of the $N^+$ substrate 20, whereby the $N^-$ substrate 10 and the $N^+$ substrate 20 are joined to each other, the junction of the substrates to each other requires a comparatively high temperature, so that warpage of the substrates is liable to occur, and the contact between the junction surfaces hence becomes insufficient. Besides, since the semiconductor substrates were joined to each other by only the thermal diffusion between the semiconductor substrates as described above, there was a problem that the junction may occur only about portions being in contact if the flatness of the substrates is poor. In some cases, conductive gate electrodes may be provided on the gate regions for the purpose of reducing the resistance of the gates. In such a case, however, there was a problem that such a good conductor is limited to a thermally stable material such as a high-melting metal or polycrystalline silicon.

It is therefore a general object of the present invention to provide a semiconductor device, by which a base in which gates are buried can be formed by the junction of semiconductor substrates to each other at a lower temperature, and a fabrication process thereof.

It is the principal object of the present invention to provide a semiconductor device, by which the junction of semiconductor substrates to each other can be performed with high reliability, and moreover a range of choice in materials for gate electrodes can be enlarged, and a fabrication process thereof.

It is another object of the present invention to provide a semiconductor device equipped with a crystalline base uniform and high in quality, and a fabrication process thereof.

It is a further object of the present invention to provide a semiconductor device, by which doping in gate regions can be performed at a high concentration, and impurity concentration at junction surfaces can be heightened to give better electrical junction, and a fabrication process thereof.

It is still a further object of the present invention to provide a semiconductor device, by which withstanding voltage in an off-state can be made high, a leakage current can also be lessened, and a high current can be controlled owing to its excellent cut-off capacity, and a fabrication process thereof.

It is yet still a further object of the present invention to provide a semiconductor device, by which a maximum cut-off current can be heightened by lessening the resistance of gates, and moreover the drawing current of a carrier can be increased, so that high-speed switching operation can be achieved, and a fabrication process thereof.

It is yet still a further object of the present invention to provide a semiconductor device, which can be efficiently fabricated by a simple process and incurs no power loss, and a fabrication process thereof.

Other objects and advantages of the present invention will be more readily appreciated from the following preferred embodiments described in detail by reference to the accompanying drawings.

BRIEF DESCRIPTION OF THE DRAWINGS

FIG. 6 is a cross-sectional view illustrating the static induction thyristor and the fabrication process thereof according to the third embodiment of the present invention.

FIG. 19 is a cross-sectional view illustrating the static induction thyristor and the fabrication process thereof according to the twelfth embodiment of the present invention.

DESCRIPTION OF THE PREFERRED EMBODIMENTS

Figure 1A:
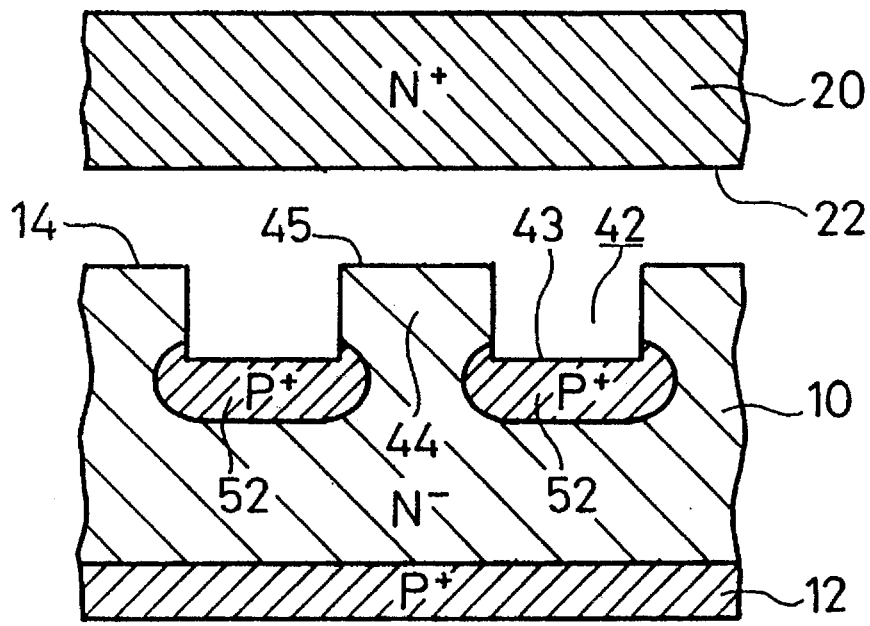
FIGS. 1A and 1B are cross-sectional views illustrating a conventional static induction thyristor and a fabrication process thereof.
Figure 1B:
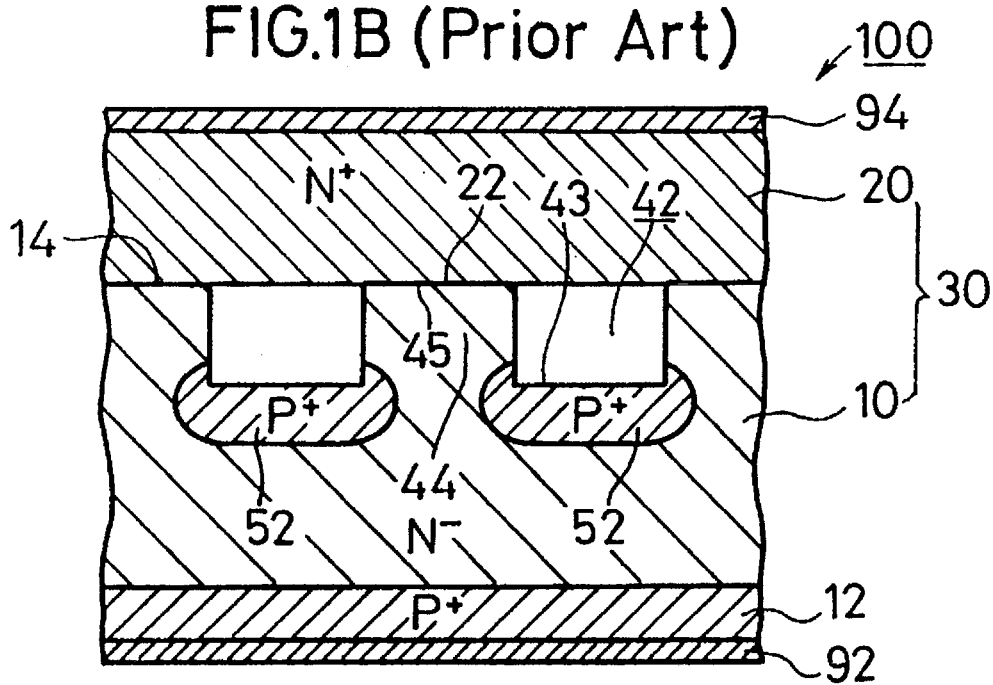

The embodiments of the present invention will hereinafter be described by reference to the accompanying drawings.

Incidentally, like reference characters in the drawings designate like or corresponding parts throughout.

(First embodiment)

Figure 2A:
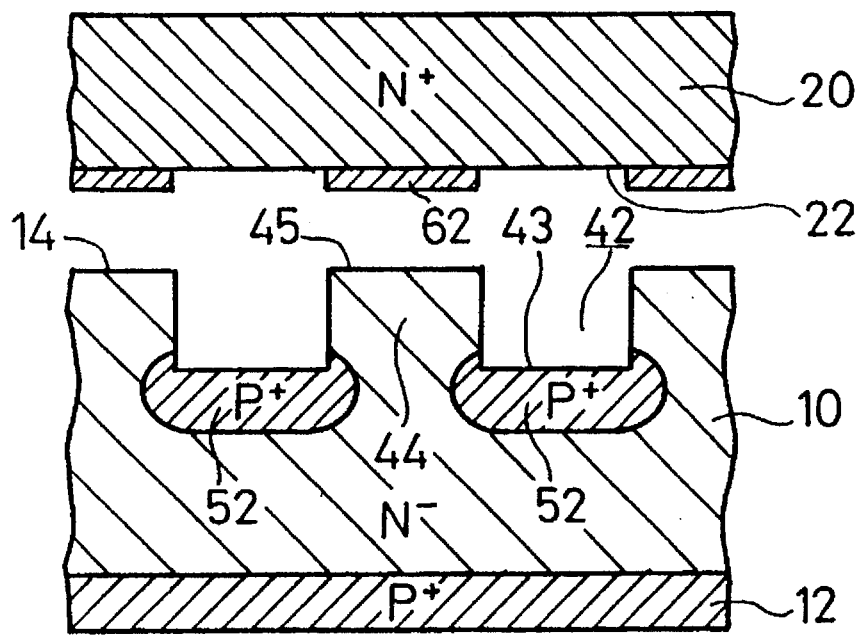
FIGS. 2A and 2B are cross-sectional views illustrating a static induction thyristor and a fabrication process thereof according to the first embodiment of the present invention.
Figure 2B:
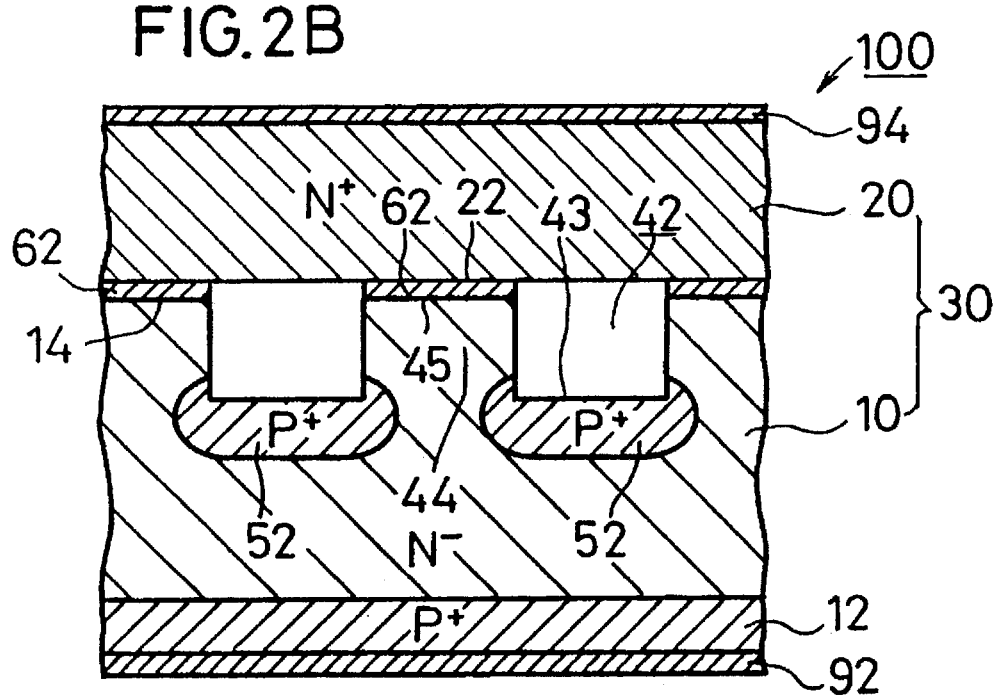

FIGS. 2A and 2B are cross-sectional views illustrating a static induction thyristor and a fabrication process thereof according to the first embodiment of the present invention.

An $N^-$ substrate 10 and an $N^+$ substrate 20, which have been subjected to mirror polishing on at least the sides to be joined to each other and are composed of Si, are first provided.

As illustrated in FIG. 2A, a plurality of recesses 42 about 50 μm wide and about 20 μm deep are then defined at a pitch of about 70 μm in the top 14 of the $N^-$ substrate 10 by a photolithography process. Thus, projections 44 are defined between the recesses 42. The recesses 42 each have sides substantially perpendicular to the top 14 of the $N^-$ substrate 10.

A $P^+$ layer 12 is then formed on the underside of the $N^-$ substrate 10 by an impurity-diffusing process.

Further, boron, which is a P-type impurity, is selectively diffused from the top side of the $N^-$ substrate 10 therein, whereby $P^+$-gate regions 52 are each formed in the whole exposed surface ranging from the bottom 43 to lower side portions of the recesses 42 defined in the $N^-$ substrate 10. Incidentally, the diffusion of boron was performed at a temperature of about 1050°–1200° C. in an atmosphere of $BBr_3$ and $O_2$. Although an oxide film is formed on the sides and bottoms of the recesses 42 and the tops 45 of the projections 44 upon the diffusion of boron, it is not shown.

On the other hand, a metal layer 62 about 3 μm thick, which is composed of an Au-Sb alloy, is formed on the underside 22 of the $N^+$ substrate 20 by a sputtering process and a photolithography process. The metal layer 62 is selectively provided at positions opposite to the tops 45 of the projections 44 exposed between the $P^+$-gate regions 52.

The $N^-$ substrate 10 and the $N^+$ substrate 20 are then cleaned by heating them in an aqueous solution of sulfuric acid and hydrogen peroxide to remove organic substances on the substrates.

The naturally formed oxide film is then removed with hydrofluoric acid as needed, and the $N^-$ substrate 10 and the $N^+$ substrate 20 are subjected to ultrasonic cleaning with purified water and dried by a spin dryer at room temperature.

The $N^-$ substrate 10 and the $N^+$ substrate 20 are then heated at about 350° C. in a hydrogen atmosphere in a state that the tops 45 of the projections 44 between the recesses 42 of the $N^-$ substrate 10 have been brought into contact with the metal layer 62 selectively provided on the underside 22 of the $N^+$ substrate 20 as illustrated in FIG. 2B, whereby the $N^-$ substrate 10 and the $N^+$ substrate 20 are joined to each other. By the way, cavities are defined in an N base 30 by the recesses 42 and the underside 22 of the $N^+$ substrate 20.

An anode electrode 92 and a cathode electrode 94, which are composed of aluminum, are then formed on the underside of the $P^+$ layer 12 formed on the underside of the $N^-$ substrate 10 and the top of the $N^+$ substrate 20, respectively.

In the static induction thyristor 100 thus fabricated, the $P^+$ layer 12 functions as an anode, while the $N^+$ substrate 20 functions not only as a cathode, but also as the N base 30 together with the $N^-$ substrate 10. The $P^+$-gate regions 52 function as a gate which controls an anode current flowing between the anode electrode 92 and the cathode electrode 94.

In this embodiment, the N base 30 in which the $P^+$-gate regions 52 are buried is formed by the junction of the $N^-$ substrate 10 and the $N^+$ substrate 20. Therefore, the N base 30 can be provided as a crystalline base uniform and high in quality. The $P^+$-gate regions 52 may also be made high in concentration, and the maximum cut-off current may hence be made higher. When the substrates 10 and 20 are joined to each other through the metal layer 62 formed of the Au-Sb alloy like this embodiment, the junction is feasible at about 350° C. or so, so that the substrates 10 and 20 can be joined uniformly to each other at a low temperature.

In this embodiment, the Au-Sb alloy is used for the metal layer 62. Since Au is good in wetting with Si, and Sb element is an n-type dopant, the impurity concentration at the junction surfaces can be made high to give better electrical junction.

In this embodiment, the metal layer 62 composed of the Au-Sb alloy is formed not on the top 14 of the $N^-$ substrate 10, but on the underside 22 of the $N^+$ substrate 20. Therefore, it is possible to avoid the short circuit of this metal layer 62 to the $P^+$-gate regions 52 formed in the $N^-$ substrate 10.

Further, since the substrate 20 is of $N^+$, better ohmic contact can be achieved.

(Second embodiment)

Figure 3A:
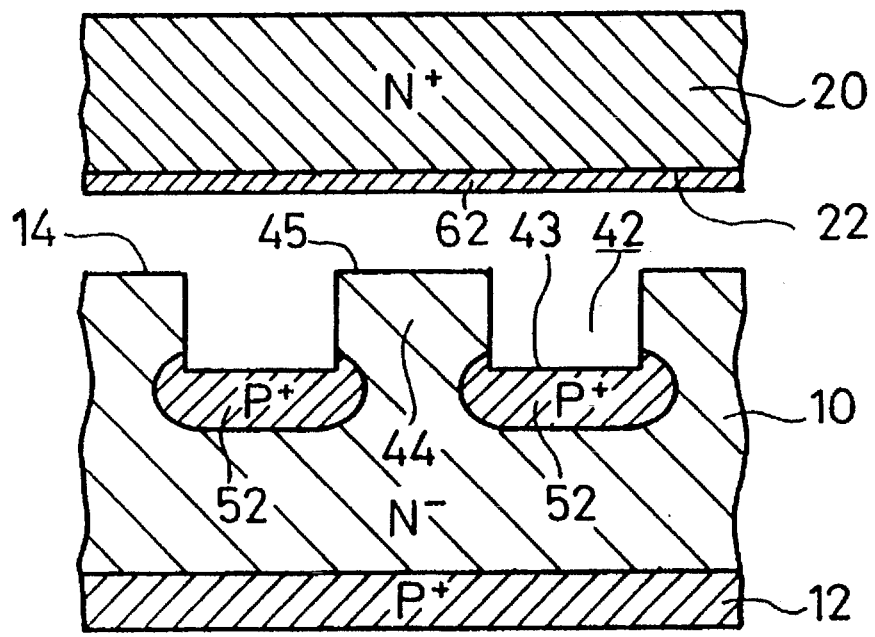
FIGS. 3A and 3B are cross-sectional views illustrating a static induction thyristor and a fabrication process thereof according to the second embodiment of the present invention.
Figure 3B:
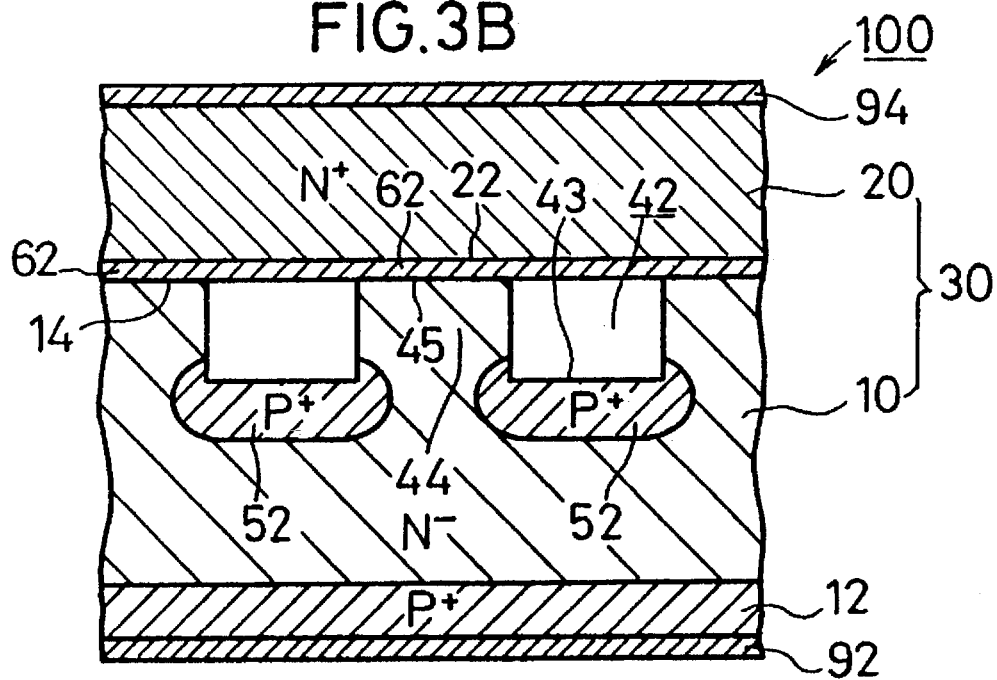

FIGS. 3A and 3B are cross-sectional views illustrating a static induction thyristor and a fabrication process thereof according to the second embodiment of the present invention.

In the first embodiment described above, the metal layer 62 formed of the Au-Sb alloy has been selectively provided on the underside 22 of the $N^+$ substrate 20 at the positions opposite to the tops 45 of the projections 44 exposed between the $P^+$-gate regions 52. This embodiment differs from the first embodiment in that a metal layer 62 formed of the Au-Sb alloy is provided on the whole surface of an underside 22 of an $N^+$ substrate 20. However, other structures and a fabrication process of the static induction thyristor 100 according to the second embodiment are the same as in the first embodiment.

When the metal layer 62 composed of the Au-Sb alloy is formed on the whole surface of the underside 22 of the $N^+$ substrate 20 like this embodiment, there is no need to conduct minute processing upon the formation of the metal layer 62 composed of the Au-Sb alloy, and so the production process is simplified.

(Third embodiment)

FIGS. 4A to 4D, FIGS. 5A to 5C and FIG. 6 are cross-sectional views illustrating a static induction thyristor and a fabrication process thereof according to the third embodiment of the present invention.

An $N^-$ substrate 10 and an $N^+$ substrate 20, which have been subjected to mirror polishing on at least the sides to be joined to each other and are composed of Si, are first provided.

Figure 4A:
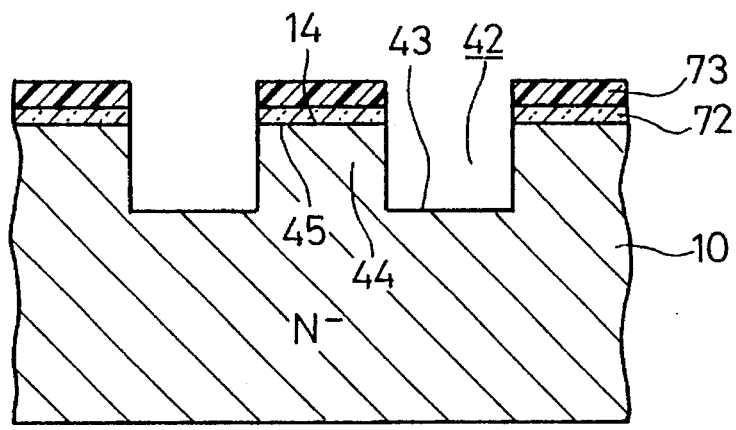
FIGS. 4A, 4B, 4C and 4D are cross-sectional views illustrating a static induction thyristor and a fabrication process thereof according to the third embodiment of the present invention.

As illustrated in FIG. 4A, an oxide film 72 is then formed on the top 14 of the $N^-$ substrate 10 by thermal oxidation, and a photoresist 73 is formed on the oxide film 72 and then patterned. The patterned photoresist 73 is then used as a mask to selectively etch the oxide film 72 and the $N^-$ substrate 10, thereby defining recesses 42 about 50 μm wide and about 20 μm deep at a pitch of about 60 μm in the top 14 of the $N^-$ substrate 10. Thus, projections 44 are defined between the recesses 42. The recesses 42 each have sides substantially perpendicular to the top 14 of the $N^-$ substrate 10.

Figure 4B:
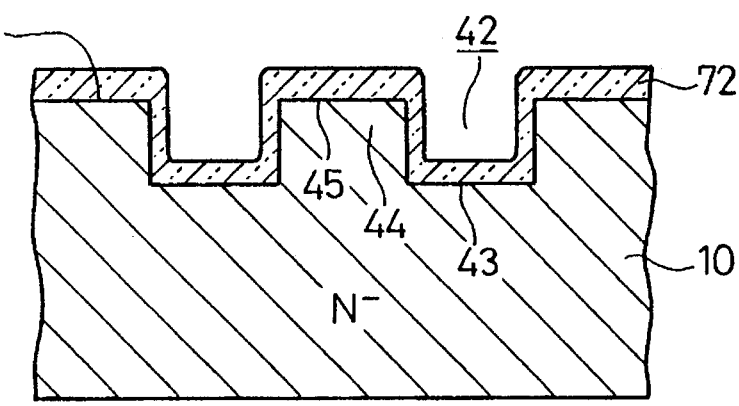

As illustrated in FIG. 4B, the whole surface of the top 14 of the $N^-$ substrate 10 is then oxidized.

Figure 4C:
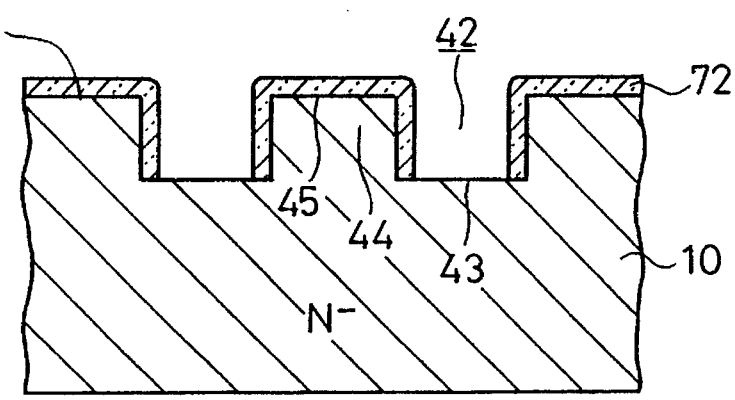

As illustrated in FIG. 4C, the whole surface of the top 14 of the $N^-$ substrate 10 is then etched by a dry etching process, thereby exposing the $N^-$ substrate 10 at the bottoms 43 of the recesses 42.

Figure 4D:
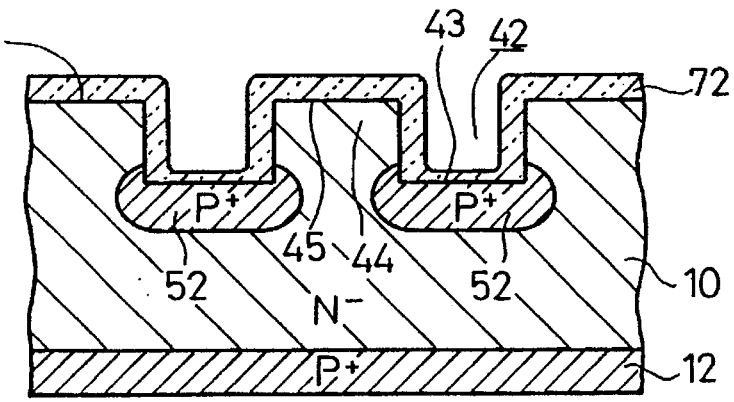

As illustrated in FIG. 4D, boron, which is a P-type impurity, is diffused from the top side and bottom side of the $N^-$ substrate 10 therein, whereby $P^+$-gate regions 52 are each formed in the whole exposed surface ranging from the bottom 43 to lower side portions of the recesses 42 defined in the $N^-$ substrate 10, and at the same time, a $P^+$ layer 12 is formed on the underside of the $N^-$ substrate 10. The diffusion of boron was performed at a temperature of about 1050°–1200° C. in an atmosphere of $BBr_3$ and $O_2$. At this stage, the $P^+$-gate regions 52 are each covered with the oxide film 72.

Figure 5A:
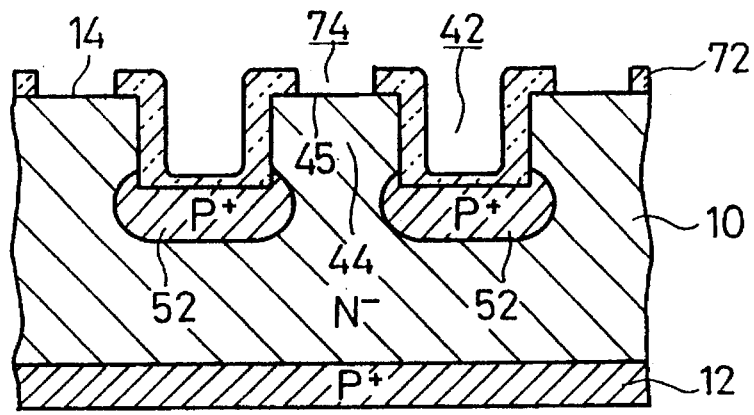
FIGS. 5A, 5B and 5C are cross-sectional views illustrating the static induction thyristor and the fabrication process thereof according to the third embodiment of the present invention.

As illustrated in FIG. 5A, an opening 74 is then defined in the oxide film 72 at each of the tops 45 of the projections 44 by a photolithography technique to partly expose the $N^-$ substrate.

Figure 5B:
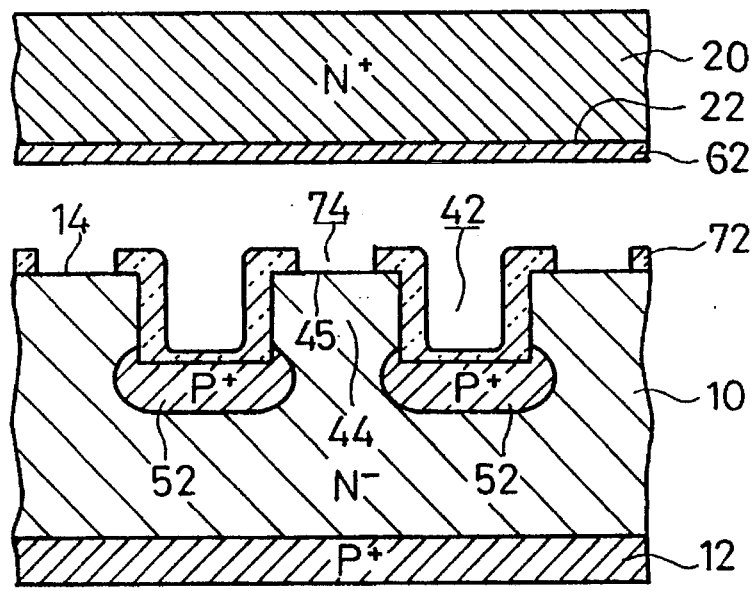

On the other hand, as illustrated in FIG. 5B, a metal layer 62 about 3 μm thick, which is composed of an Au-Sb alloy, is formed on the whole surface of the underside 22 of the $N^+$ substrate 20 by a sputtering process.

The $N^-$ substrate 10 and the $N^+$ substrate 20 are then subjected to ultrasonic cleaning with an aqueous solution of sulfuric acid and hydrogen peroxide, thereby removing organic substances and metals on the substrates.

The $N^-$ substrate 10 and the $N^+$ substrate 20 are then washed with purified water and dried by a spin dryer at room temperature.

Figure 5C:
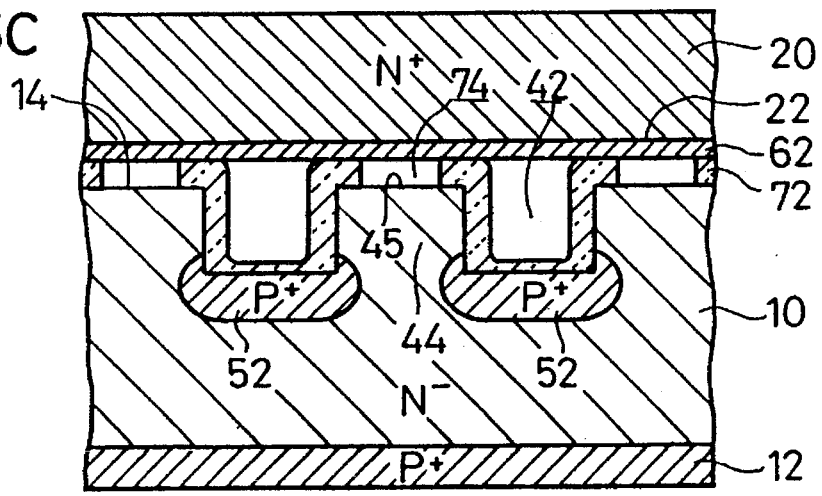

The $N^-$ substrate 10 and the $N^+$ substrate 20 are then heated at about 360° C. in a hydrogen atmosphere in a state that the oxide film 72 on the $N^-$ substrate 10 has been brought into contact with the metal layer 62 provided on the underside 22 of the $N^+$ substrate 20 as illustrated in FIG. 5C, whereby the $N^-$ substrate 10 and the $N^+$ substrate 20 are joined to each other as illustrated in FIG. 6. Upon this junction under heat, a part of the metal layer 62 shifts into the openings 74 defined in the oxide film 72 to serve as a metal 64 in the openings 74. The $N^-$ substrate 10 and the $N^+$ substrate 20 are electrically connected to each other through this metal 64 and the metal layer 62.

An anode electrode 92 and a cathode electrode 94, which are composed of aluminum, are then formed on the underside of the $P^+$ layer 12 formed on the underside of the $N^-$ substrate 10 and the top of the $N^+$ substrate 20, respectively.

In the static induction thyristor 100 thus fabricated, the $P^+$ layer 12 functions as an anode, while the $N^+$ substrate 20 functions not only as a cathode, but also as an N base 30 together with the $N^-$ substrate 10. The $P^+$-gate regions 52 function as a gate which controls an anode current flowing between the anode electrode 92 and the cathode electrode 94.

In this embodiment, also, the N base 30 in which the $P^+$-gate regions 52 are buried is formed by the junction of the $N^-$ substrate 10 and the $N^+$ substrate 20. Therefore, the N base 30 can be provided as a crystalline base uniform and high in quality. The $P^+$-gate regions 52 may also be made high in concentration, and the maximum cut-off current may hence be made higher. When the substrates 10 and 20 are joined to each other through the metal layer 62 formed of the Au-Sb alloy like this embodiment, the junction is feasible at about 350° C. or so, so that the substrates 10 and 20 can be joined uniformly to each other at a low temperature.

In this embodiment, the Au-Sb alloy is used for the metal layer 62. Since Au is good in wetting with Si, and Sb element is an n-type dopant, the impurity concentration at the junction surfaces can be made high to give better electrical junction.

In this embodiment, the metal layer 62 composed of the Au-Sb alloy is formed not on the top 14 of the N⁻ substrate 10, but on the underside 22 of the N⁺ substrate 20. Therefore, it is possible to avoid the short circuit of this metal layer 62 to the P⁺-gate regions 52 formed in the N⁻ substrate 10.

Besides, since the P⁺-gate regions 52 are each covered with the oxide film 72 in this embodiment, it is possible to avoid the short circuit of the P⁺-gate regions 52 to the cathode electrode 94 due to the shifting of the Au-Sb alloy upon the junction of the N⁻ substrate 10 to the N⁺ substrate 20. As a result, reduction in withstanding voltage can be avoided.

Further, since the substrate 20 is of N⁺, better ohmic contact can be achieved.

(Fourth embodiment)

Figure 7A:
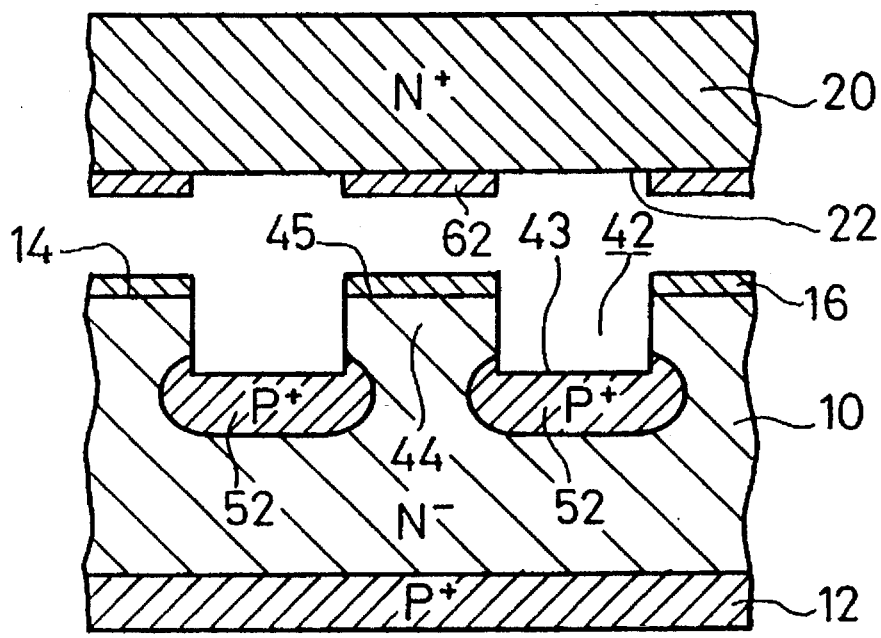
FIGS. 7A and 7B are cross-sectional views illustrating a static induction thyristor and a fabrication process thereof according to the fourth embodiment of the present invention.
Figure 7B:
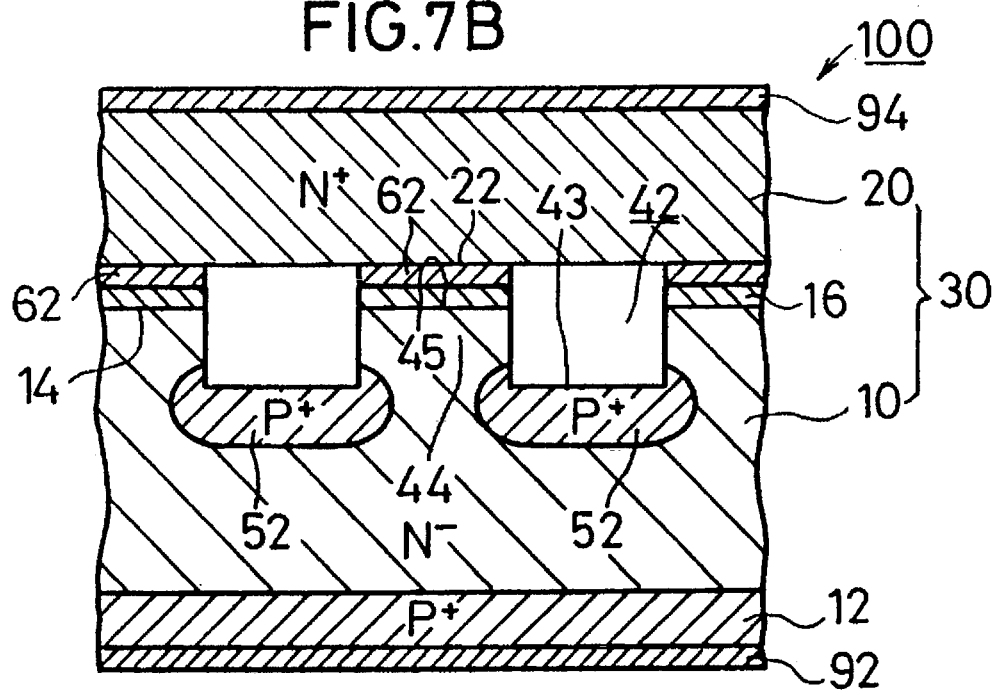

FIGS. 7A and 7B are cross-sectional views illustrating a static induction thyristor and a fabrication process thereof according to the fourth embodiment of the present invention.

In the first embodiment described above, the tops 45 of the projections 44 of the N⁻ substrate 10 have been joined to the metal layer 62. The thyristor 100 according to this embodiment differs from the thyristor 100 of the first embodiment in that N⁺ regions 16 are separately provided on the tops 45 of projections 44 of an N⁻ substrate 10, and the tops 45 of the projections 44 of the N⁻ substrate 10 are joined to the metal layer 62 through these N⁺ regions 16. However, other structures are the same as in the first embodiment.

The fabrication process of this embodiment differs from that of the first embodiment in that the N⁺ regions 16 are first formed on the top 14 of the N⁻ substrate 10, and the recesses 42 are then defined as illustrated in FIG. 7A. However, other respects are the same as in the fabrication process of the first embodiment. According to the fabrication process of this embodiment, the static induction thyristor 100 illustrated in FIG. 7B can be provided.

The provision of the N⁺ regions 16 like this embodiment permits better electric connection.

(Fifth embodiment)

Figure 8A:
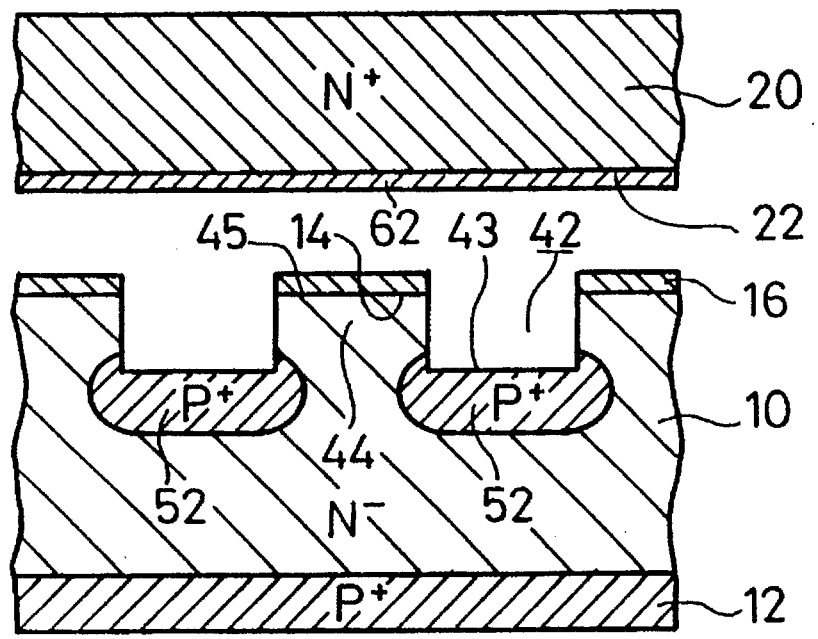
FIGS. 8A and 8B are cross-sectional views illustrating a static induction thyristor and a fabrication process thereof according to the fifth embodiment of the present invention.
Figure 8B:
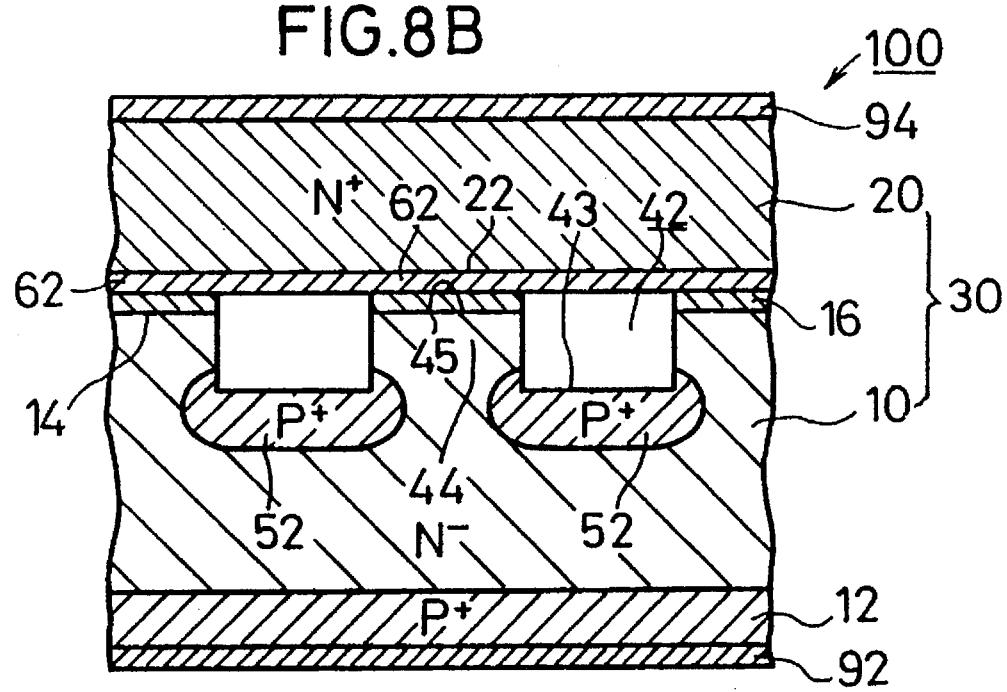

FIGS. 8A and 8B are cross-sectional views illustrating a static induction thyristor and a fabrication process thereof according to the fifth embodiment of the present invention.

In the second embodiment described above, the tops 45 of the projections 44 of the N⁻ substrate 10 have been joined to the metal layer 62. The thyristor 100 according to this embodiment differs from the thyristor 100 of the second embodiment in that N⁺ regions 16 are separately provided on the tops 45 of projections 44 of an N⁻ substrate 10, and the tops 45 of the projections 44 of the N⁻ substrate 10 are joined to the metal layer 62 through these N⁺ regions 16. However, other structures are the same as in the second embodiment.

The fabrication process of this embodiment differs from that of the second embodiment in that the N⁺ regions 16 are first formed on the top 14 of the N⁻ substrate 10, and the recesses 42 are then defined as illustrated in FIG. 8A. However, other respects are the same as in the fabrication process of the second embodiment. According to the fabrication process of this embodiment, the static induction thyristor 100 illustrated in FIG. 8B can be provided.

The provision of the N⁺ regions 16 like this embodiment permits better electric connection.

(Sixth embodiment)

FIGS. 9A to 9C and FIG. 10 are cross-sectional views illustrating a static induction thyristor and a fabrication process thereof according to the sixth embodiment of the present invention.

In the third embodiment described above, the tops 45 of the projections 44 of the N⁻ substrate 10 have been directly joined to the metal layer 62. The thyristor 100 according to this embodiment differs from the thyristor 100 of the third embodiment in that N⁺ regions 16 are separately provided on the tops 45 of projections 44 of an N⁻ substrate 10, and the tops 45 of the projections 44 of the N⁻ substrate 10 are joined to the metal layer 62 on the N⁺ substrate 20 through these N⁺ regions 16. However, other structures are the same as in the third embodiment.

Figure 9A:
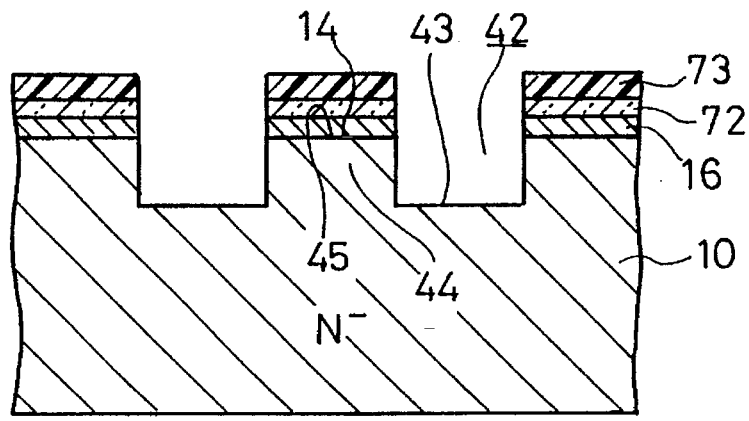
FIGS. 9A, 9B and 9C are cross-sectional views illustrating a static induction thyristor and a fabrication process thereof according to the sixth embodiment of the present invention.
Figure 9B:
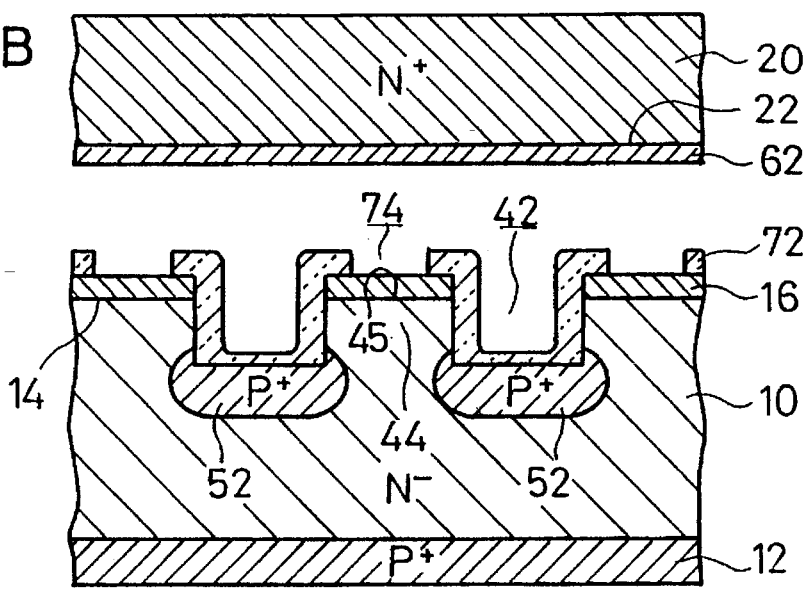
Figure 9C:
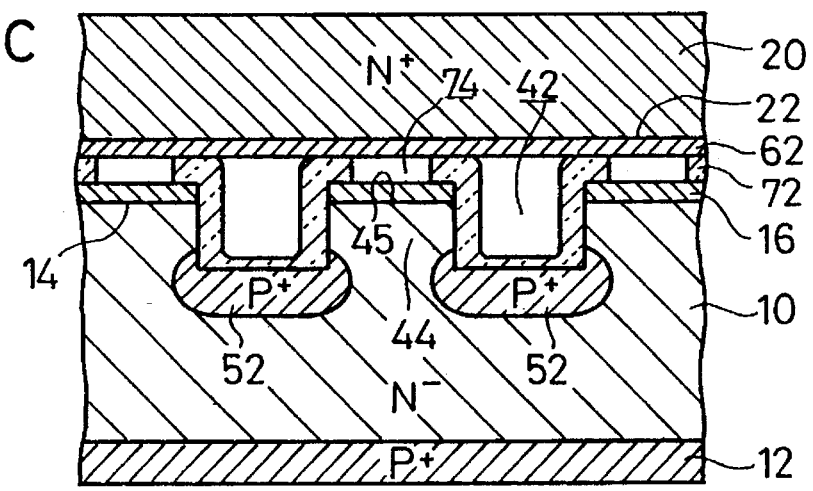
Figure 10:
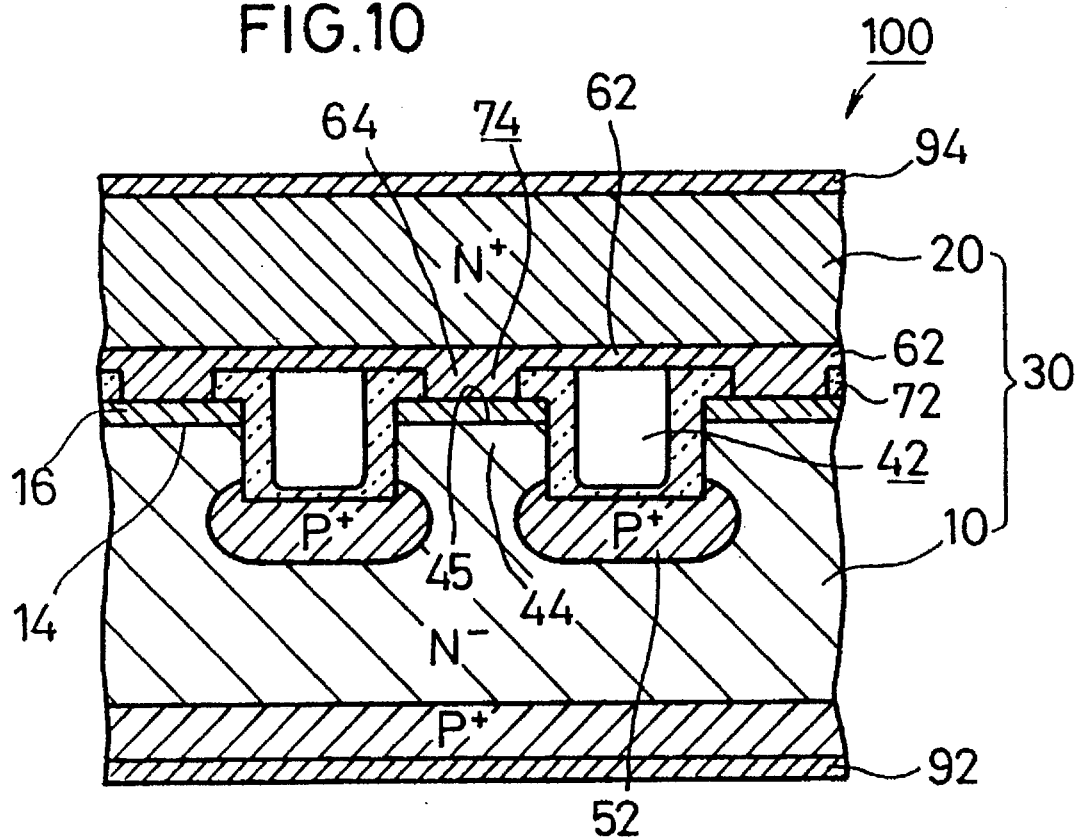
FIG. 10 is a cross-sectional view illustrating the static induction thyristor and the fabrication process thereof according to the sixth embodiment of the present invention.

The fabrication process of this embodiment differs from that of the third embodiment in that the N⁺ regions 16 are first formed on the top 14 of the N⁻ substrate 10, and the recesses 42 are then defined as illustrated in FIG. 9A. However, other respects are the same as in the fabrication process of the third embodiment. According to the fabrication process of this embodiment, the static induction thyristor 100 illustrated in FIG. 10 can be provided through the processes illustrated in FIGS. 9B and 9C.

The provision of the N⁺ regions 16 like this embodiment permits better electric connection.

(Seventh embodiment)

Figure 11A:
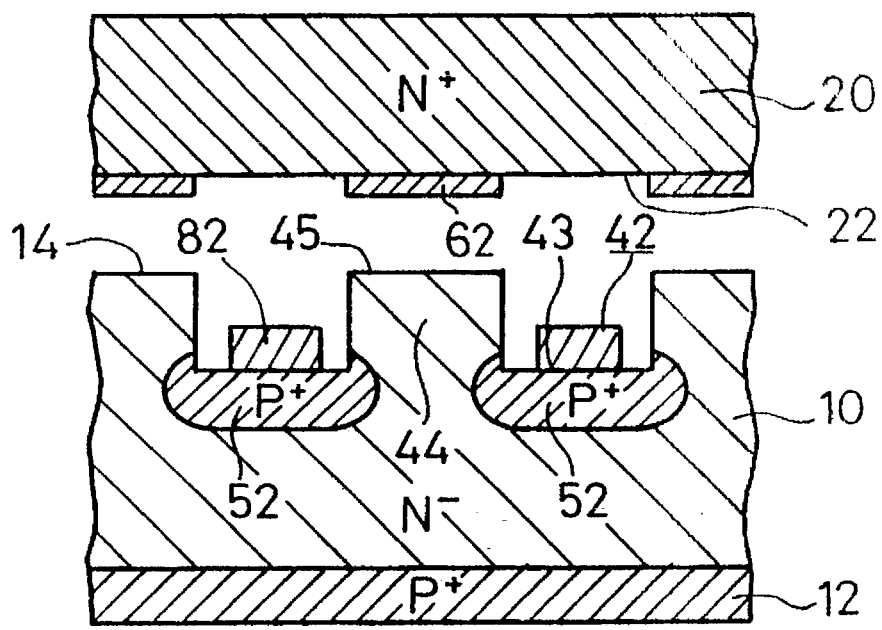
FIGS. 11A and 11B are cross-sectional views illustrating a static induction thyristor and a fabrication process thereof according to the seventh embodiment of the present invention.
Figure 11B:
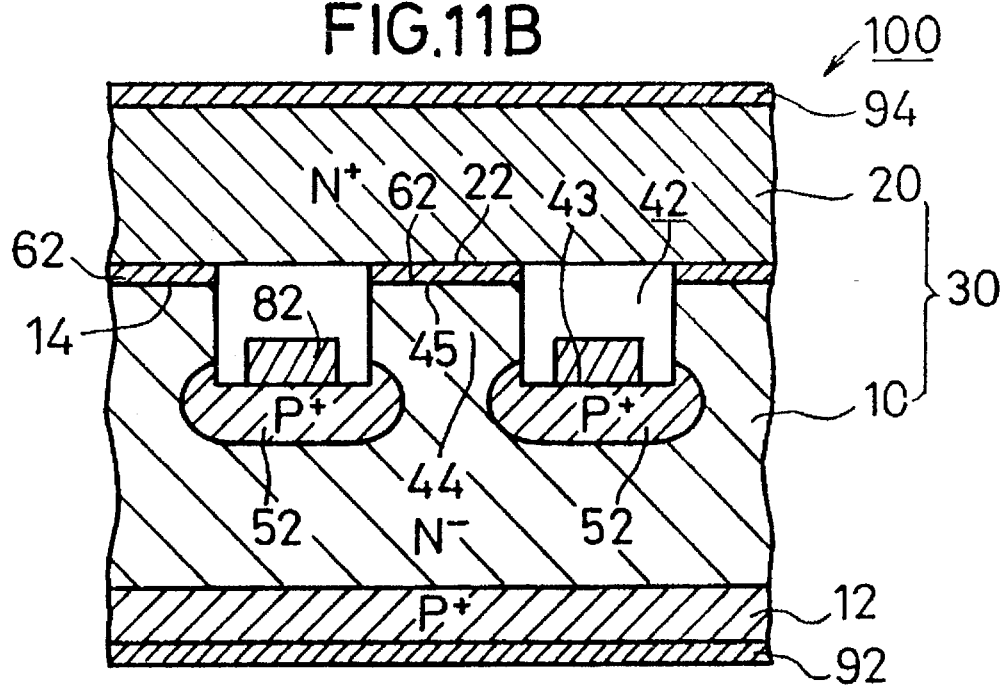

FIGS. 11A and 11B are cross-sectional views illustrating a static induction thyristor and a fabrication process thereof according to the seventh embodiment of the present invention.

An N⁻ substrate 10 and an N⁺ substrate 20, which have been subjected to mirror polishing on at least the sides to be joined to each other and are composed of Si, are first provided.

As illustrated in FIG. 11A, a plurality of recesses 42 about 40 μm wide and about 15 μm deep are then defined at a pitch of about 50 μm in the top 14 of the N⁻ substrate 10 by a photolithography process. Thus, projections 44 are defined between the recesses 42. The recesses 42 each have sides substantially perpendicular to the top 14 of the N⁻ substrate 10.

A P⁺ layer 12 is then formed on the underside of the N⁻ substrate 10 by an impurity-diffusing process.

Further, boron, which is a P-type impurity, is selectively diffused from the top side of the N⁻ substrate 10 therein, whereby P⁺-gate regions 52 are each formed in the whole exposed surface ranging from the bottom 43 to lower side portions of the recesses 42 defined in the N⁻ substrate 10. Incidentally, the diffusion of boron was performed at a temperature of about 1050°–1200° C. in an atmosphere of $BBr_3$ and $O_2$.

Respective gate electrodes 82 each having a width of about 30 μm composed of tungsten are then selectively formed within the recesses 42 on the P⁺-gate regions 52.

On the other hand, a metal layer 62 about 10 μm thick, which is composed of an Au-Sb alloy, is formed on the underside 22 of the N⁺ substrate 20 by a sputtering process and a photolithography process. The metal layer 62 is selectively provided at positions opposite to the tops 45 of the projections 44 exposed between the P⁺-gate regions 52.

The N⁻ substrate 10 and the N⁺ substrate 20 are then subjected to ultrasonic cleaning with an aqueous solution of sulfuric acid and hydrogen peroxide, thereby removing organic substances and metals on the substrates.

The N⁻ substrate 10 and the N⁺ substrate 20 are then washed with purified water and dried by a spin dryer at room temperature.

The N⁻ substrate 10 and the N⁺ substrate 20 are then heated at about 360° C. in a hydrogen atmosphere in a state that the tops 45 of the projections 44 between the recesses 42 of the N⁻ substrate 10 have been brought into contact with the metal layer 62 selectively provided on the underside 22 of the N$^+$ substrate 20 as illustrated in FIG. 11B, whereby the N$^-$ substrate 10 and the N$^+$ substrate 20 are joined to each other. By the way, cavities are defined in an N base 30 by the recesses 42 and the underside 22 of the N$^+$ substrate 20.

An anode electrode 92 and a cathode electrode 94, which are composed of aluminum, are then formed on the underside of the P$^+$ layer 12 formed on the underside of the N$^-$ substrate 10 and the top of the N$^+$ substrate 20, respectively.

In the static induction thyristor 100 thus fabricated, the P$^+$ layer 12 functions as an anode, while the N$^+$ substrate 20 functions not only as a cathode, but also as the N base 30 together with the N$^-$ substrate 10. The P$^+$-gate regions 52 function as a gate which controls an anode current flowing between the anode electrode 92 and the cathode electrode 94.

In this embodiment, the respective gate electrodes 82 electrically connected to the P$^+$-gate regions 52 and composed of tungsten are provided within the recesses 42, whereby the resistance of the gate in a lateral direction can be reduced, and so a maximum cut-off current can be heightened, and moreover the drawing current of a carrier can be increased, so that switching operation can be conducted at higher speed.

Since each of the gate electrodes 82 has been already provided within the recess 42 in the N$^-$ substrate 10 before the junction of the top 14 of the N$^-$ substrate 10 and the underside of the N$^+$ substrate 20, there is no need to cut grooves high in aspect ratio in the N$^+$ substrate 20 from the outside to form the gate electrodes 82 within the grooves even when such gate electrodes 82 are provided. As a result, the N$^+$ substrate 20 is prevented from being finely divided by the grooves at portions over the gate electrodes 82 to increase its resistance.

Since the recesses 42 defined in the top 14 of the N$^-$ substrate 10 are required only to have a size sufficient to contain the gate electrode 82 therein, the formation of the recesses 42 does not take very long even when the recesses 42 are formed by a dry etching process low in etching speed.

Further, since the gate electrodes 82 are each provided within the recess 42 defined in the top 14 of the N$^-$ substrate 10, the N$^+$ substrate 20 to be joined to the top 14 of the N$^-$ substrate 10 is not required to define any recess in the underside 22 thereof. Therefore, the underside 22 may be flat, which makes the fabrication of the thyristor 100 easy.

In this embodiment, also, the N base 30 in which the P$^+$-gate regions 52 are buried is formed by the junction of the N$^-$ substrate 10 and the N$^+$ substrate 20. Therefore, the N base 30 can be provided as a crystalline base uniform and high in quality. The P$^+$-gate regions 52 may also be made high in concentration, and the maximum cut-off current may hence be made higher. When the substrates 10 and 20 are joined to each other through the metal layer 62 formed of the Au-Sb alloy like this embodiment, the junction is feasible at about 350° C. or so, so that the substrates 10 and 20 can be joined uniformly to each other at a low temperature.

In this embodiment, also, the Au-Sb alloy is used for the metal layer 62. Since Au is good in wetting with Si, and Sb element is an n-type dopant, the impurity concentration at the junction surfaces can be made high to give better electrical junction.

In this embodiment, also, the metal layer 62 composed of the Au-Sb alloy is formed not on the top 14 of the N$^-$ substrate 10, but on the underside 22 of the N$^+$ substrate 20. Therefore, it is possible to avoid the short circuit of this metal layer 62 to the P$^+$-gate regions 52 formed in the N$^-$ substrate 10.

Further, since the substrate 20 is of N$^+$ also in this embodiment, electrically better ohmic contact can be achieved.

(Eighth embodiment)

Figure 12A:
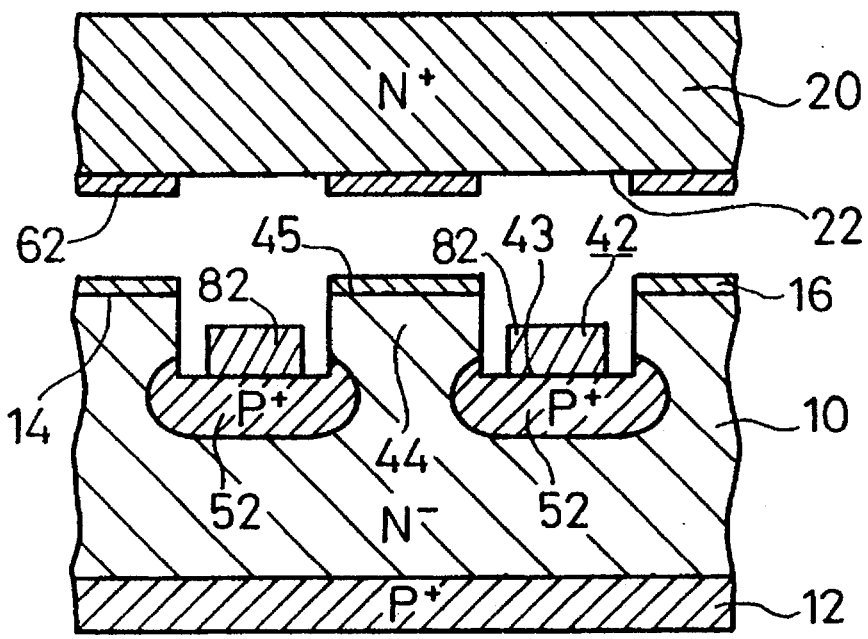
FIGS. 12A and 12B are cross-sectional views illustrating a static induction thyristor and a fabrication process thereof according to the eighth embodiment of the present invention.
Figure 12B:
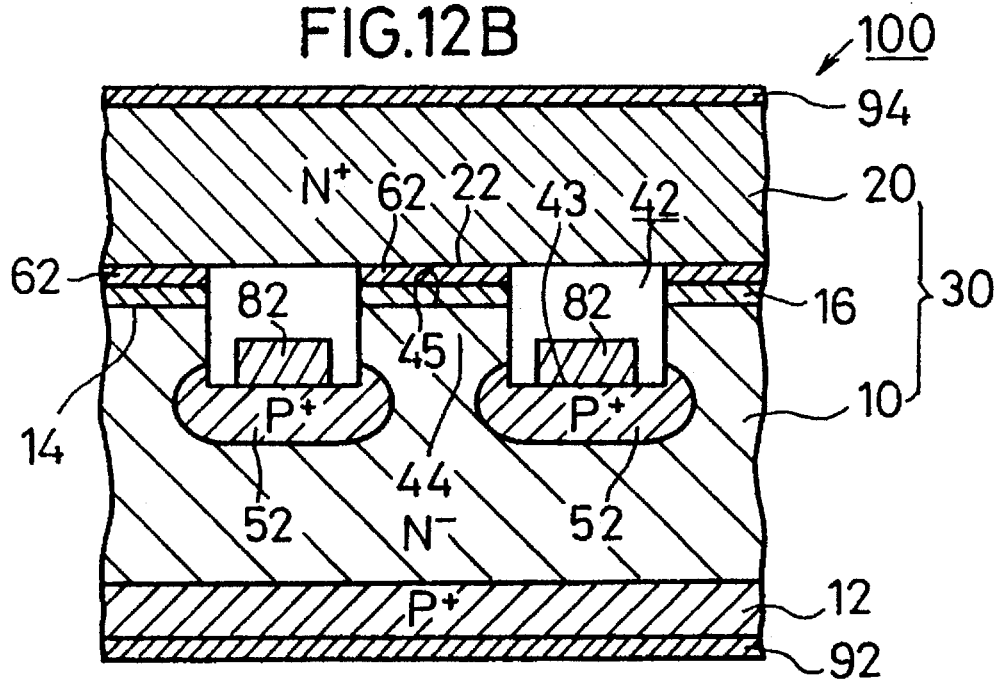

FIGS. 12A and 12B are cross-sectional views illustrating a static induction thyristor and a fabrication process thereof according to the eighth embodiment of the present invention.

In the seventh embodiment described above, the tops 45 of the projections 44 of the N$^-$ substrate 10 have been directly joined to the metal layer 62. The thyristor 100 according to this embodiment differs from the thyristor 100 of the seventh embodiment in that N$^+$ regions 16 are separately provided on the tops 45 of projections 44 of an N$^-$ substrate 10, and the tops 45 of the projections 44 of the N$^-$ substrate 10 are joined to the metal layer 62 on the N$^+$ substrate 20 through these N$^+$ regions 16. However, other structures are the same as in the seventh embodiment.

The fabrication process of this embodiment differs from that of the seventh embodiment in that the N$^+$ regions 16 are first formed on the top 14 of the N$^-$ substrate 10, and the recesses 42 are then defined as illustrated in FIG. 12A. However, other respects are the same as in the fabrication process of the seventh embodiment. According to the fabrication process of this embodiment, the static induction thyristor 100 illustrated in FIG. 12B can be provided.

The provision of the N$^+$ regions 16 like this embodiment permits better electric connection.

(Ninth embodiment)

Figure 13A:
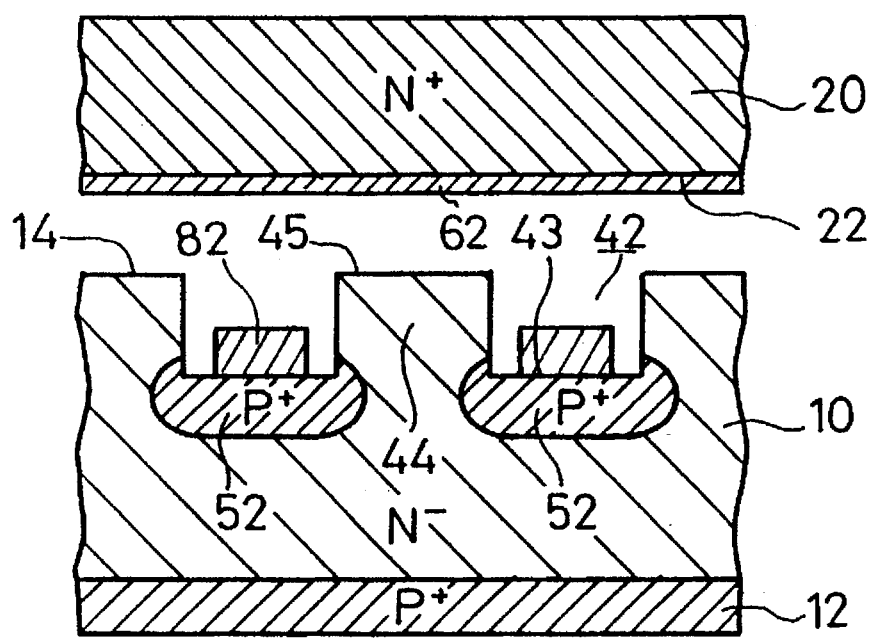
FIGS. 13A and 13B are cross-sectional views illustrating a static induction thyristor and a fabrication process thereof according to the ninth embodiment of the present invention.
Figure 13B:
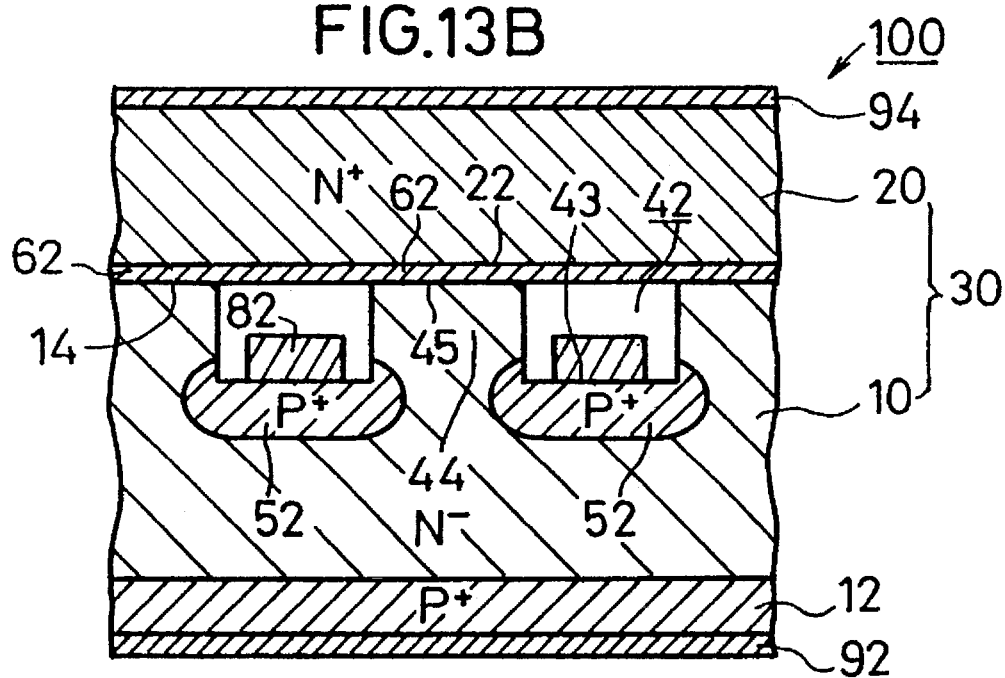

FIGS. 13A and 13B are cross-sectional views illustrating a static induction thyristor and a fabrication process thereof according to the ninth embodiment of the present invention.

In the eighth embodiment described above, the metal layer 62 formed of the Au-Sb alloy has been selectively provided on the underside 22 of the N$^+$ substrate 20 at the positions opposite to the tops 45 of the projections 44 exposed between the P$^+$-gate regions 52. This embodiment differs from the eighth embodiment in that a metal layer 62 formed of the Au-Sb alloy is provided on the whole surface of an underside 22 of an N$^+$ substrate 20. However, other structures and a fabrication process of the static induction thyristor 100 according to the ninth embodiment are the same as in the eight embodiment, and the static induction thyristor 100 illustrated in FIG. 13B can be provided.

When the metal layer 62 composed of the Au-Sb alloy is formed on the whole surface of the underside 22 of the N$^+$ substrate 20 like this embodiment, there is no need to conduct minute processing upon the formation of the metal layer 62 composed of the Au-Sb alloy, and so the production process is simplified.

(Tenth embodiment)

Figure 14A:
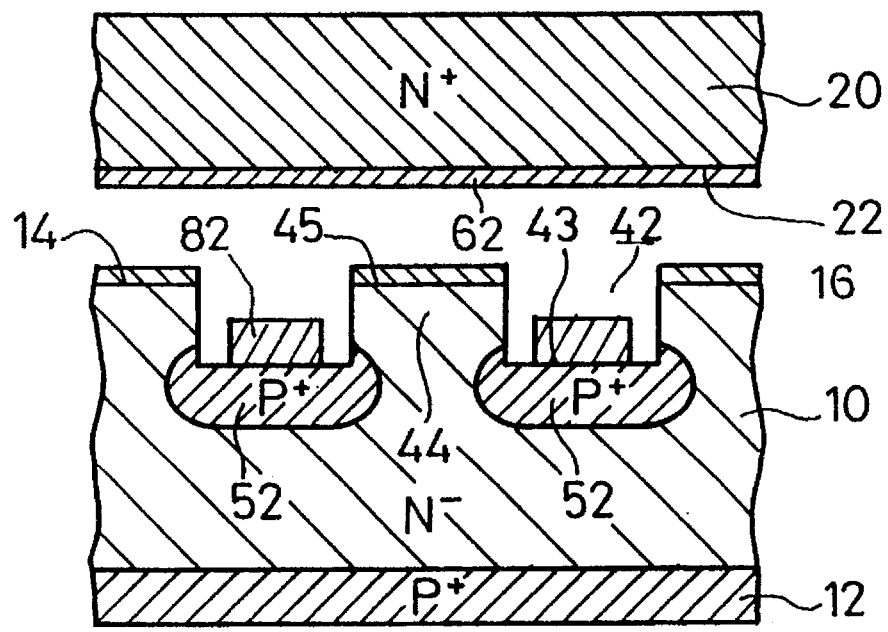
FIGS. 14A and 14B are cross-sectional views illustrating a static induction thyristor and a fabrication process thereof according to the tenth embodiment of the present invention.
Figure 14B:
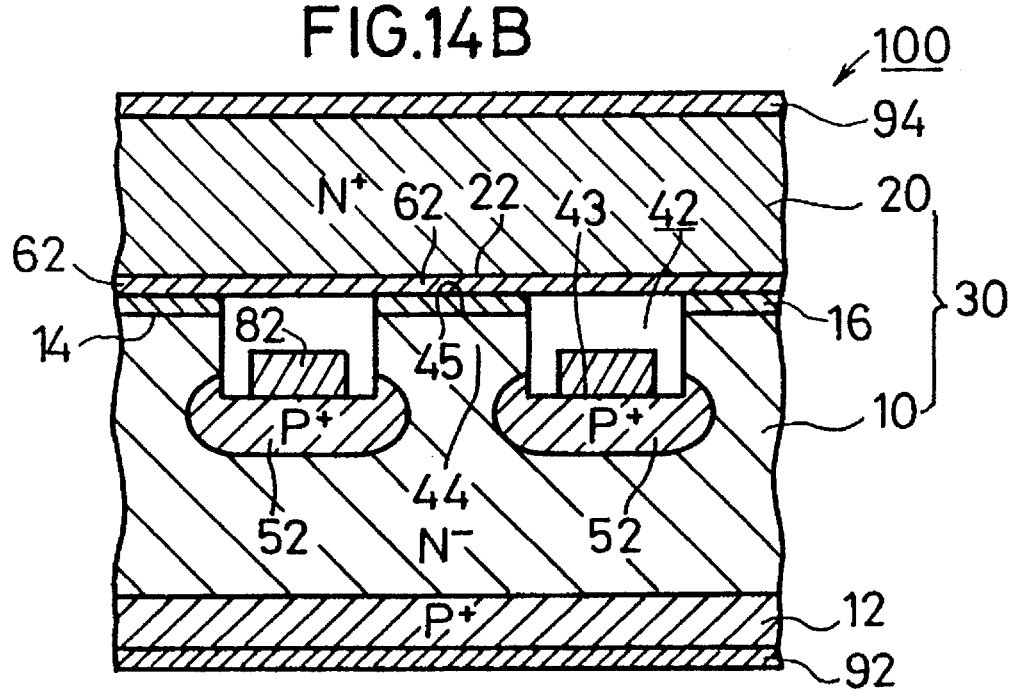

FIGS. 14A and FIG. 14B are cross-sectional views illustrating a static induction thyristor and a fabrication process thereof according to the tenth embodiment of the present invention.

In the ninth embodiment described above, the tops 45 of the projections 44 of the N$^-$ substrate 10 have been directly joined to the metal layer 62. The thyristor 100 according to this embodiment differs from the thyristor 100 of the ninth embodiment in that N$^+$ regions 16 are separately provided on the tops 45 of projections 44 of an N$^-$ substrate 10, and the tops 45 of the projections 44 of the N$^-$ substrate 10 are joined to the metal layer 62 on the N$^+$ substrate 20 through these N$^+$ regions 16. However, other structures are the same as in the third embodiment.

The fabrication process of this embodiment differs from that of the ninth embodiment in that the N$^+$ regions 16 are first formed on the top 14 of the N⁻ substrate 10, and the recesses 42 are then defined as illustrated in FIG. 14A. However, other respects are the same as in the fabrication process of the ninth embodiment. According to the fabrication process of this embodiment, the static induction thyristor 100 illustrated in FIG. 14B can be provided.

The provision of the N⁺ regions 16 like this embodiment permits better electric connection.

(Eleventh embodiment)

FIGS. 15A to 15D, FIGS. 16A to 16D and FIGS. 17A to 17C are cross-sectional views illustrating a static induction thyristor and a fabrication process thereof according to the eleventh embodiment of the present invention.

An N⁻ substrate 10 and an N⁺ substrate 20, which have been subjected to mirror polishing on at least the sides to be joined to each other and are composed of Si, are first provided.

Figure 15A:
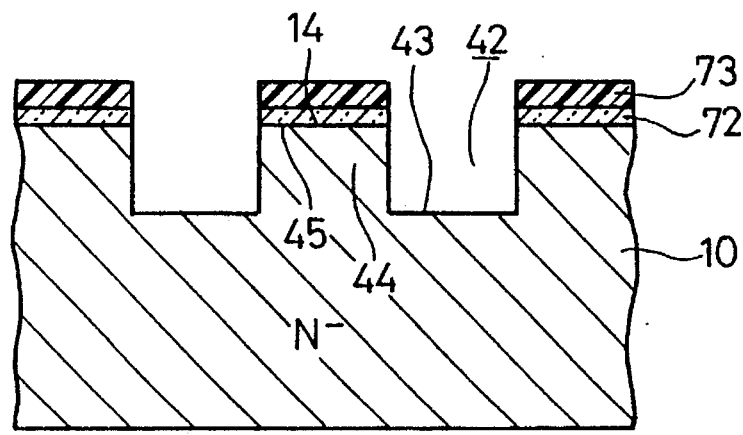
FIGS. 15A, 15B, 15C and 15D are cross-sectional views illustrating a static induction thyristor and a fabrication process thereof according to the eleventh embodiment of the present invention.

As illustrated in FIG. 15A, an oxide film 72 is then formed on the top 14 of the N⁻ substrate 10 by thermal oxidation, and a photoresist 73 is formed on the oxide film 72 and then patterned. The patterned photoresist 73 is then used as a mask to selectively etch the oxide film 72 and the N⁻ substrate 10, thereby defining a plurality of recesses 42 about 50 μm wide and about 20 μm deep at a pitch of about 60 μm in the top 14 of the N⁻ substrate 10. Thus, projections 44 are defined between the recesses 42. The recesses 42 each have sides substantially perpendicular to the top 14 of the N⁻ substrate 10.

Figure 15B:
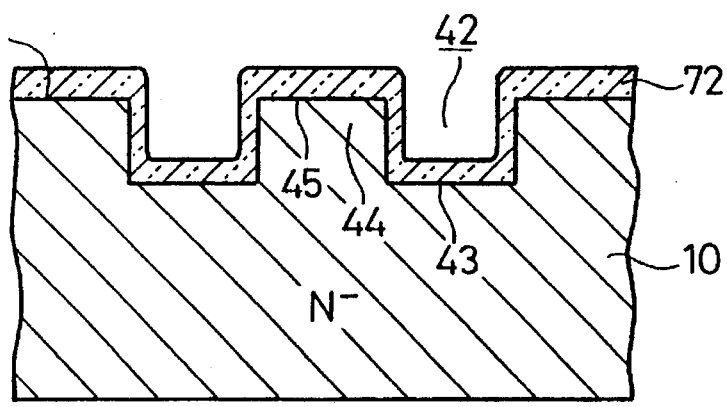

As illustrated in FIG. 15B, the whole surface of the top 14 of the N⁻ substrate 10 is then oxidized.

Figure 15C:
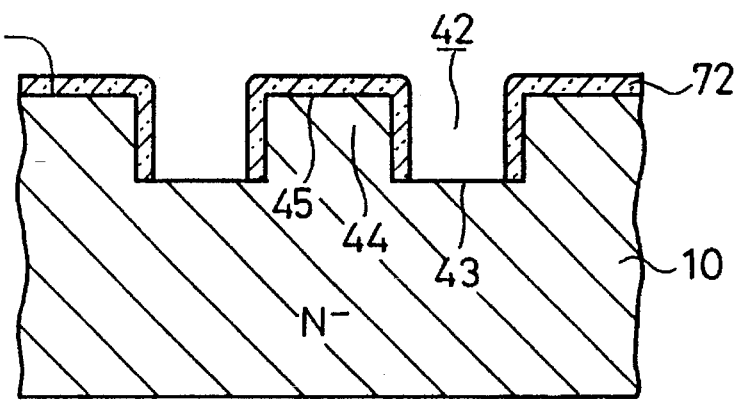

As illustrated in FIG. 15C, the whole surface of the top 14 of the N⁻ substrate 10 is then etched by a dry etching process, thereby exposing the N⁻ substrate 10 at the bottoms 43 of the recesses 42.

Figure 15D:
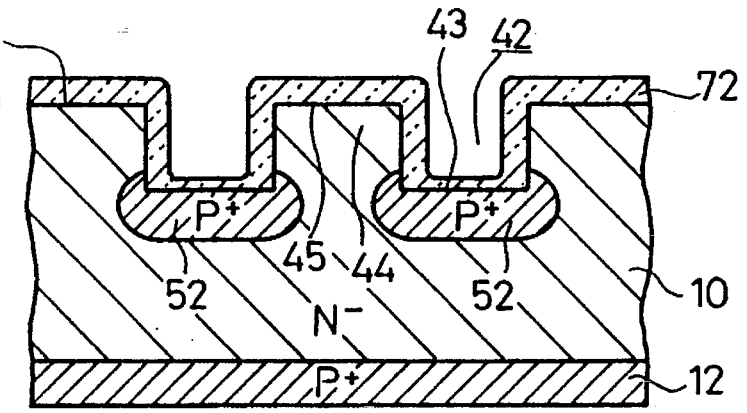

As illustrated in FIG. 15D, boron, which is a P-type impurity, is diffused from the top side and bottom side of the N⁻ substrate 10 therein, whereby P⁺-gate regions 52 are each formed in the whole exposed surface ranging from the bottom 43 to lower side portions of the recesses 42 defined in the N⁻ substrate 10, and at the same time, a P⁺ layer 12 is formed on the underside of the N⁻ substrate 10. The diffusion of boron was performed at a temperature of about 1050°–1200° C. in an atmosphere of $BBr_3$ and $O_2$. At this stage, the P⁺-gate regions 52 are each covered with the oxide film 72.

Figure 16A:
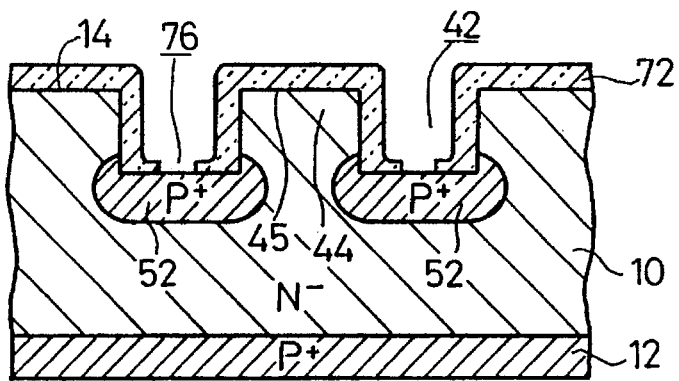
FIGS. 16A, 16B, 16C and 16D are cross-sectional views illustrating the static induction thyristor and the fabrication process thereof according to the eleventh embodiment of the present invention.

As illustrated in FIG. 16A, an opening 76 is then defined in the oxide film 72 within each of the recesses 42 to expose the P⁺-gate region 52.

Figure 16B:
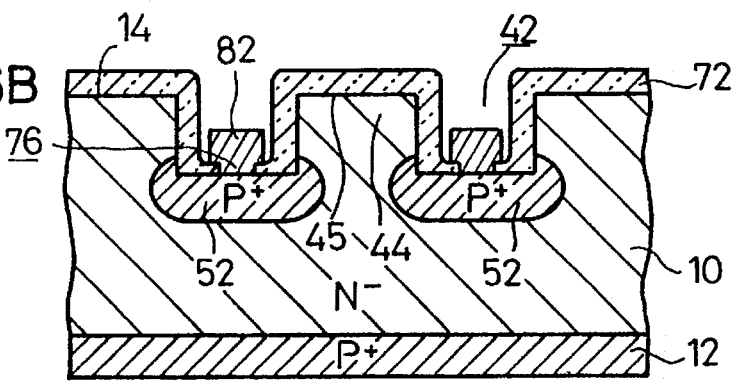

As illustrated in FIG. 16B, respective gate electrodes 82 each having a width of about 30 μm and a film thickness of about 0.5 μm and composed of tungsten are selectively formed within the recesses 42 on the P⁺-gate regions 52 so as to electrically connect to the P⁺-gate regions 52.

Figure 16C:
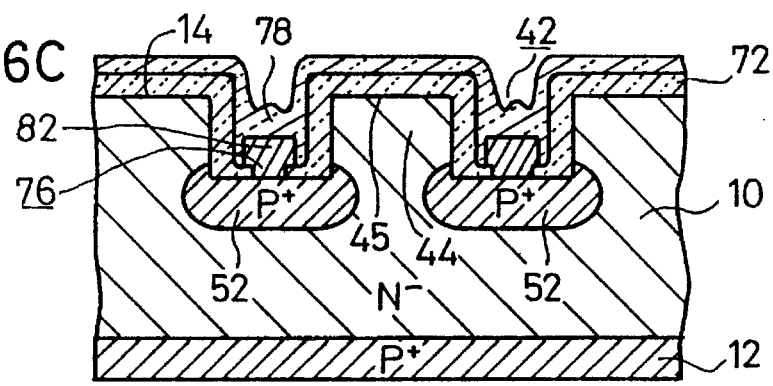

As illustrated in FIG. 16C, an oxide film 78 is then formed on the whole exposed surface on the top side of the substrate 10 by a CVD process.

Figure 16D:
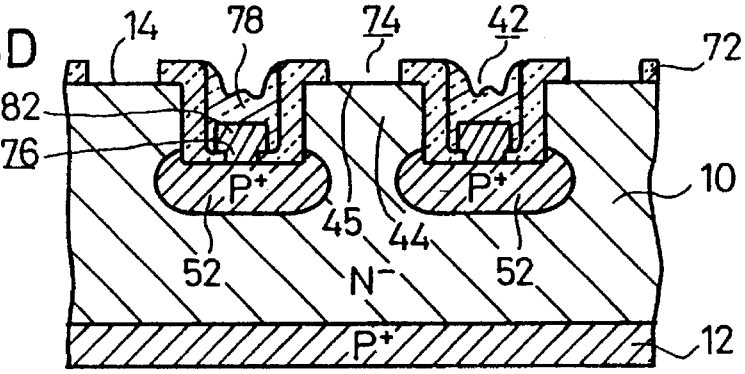

As illustrated in FIG. 16D, the oxide film 78 on the oxide film 72 is then removed except portions on the gate electrodes 82 by a photolithography process, and thereafter, an opening 74 is defined in the oxide film 72 at each of the tops 45 of the projections 44 by a photolithography process to partly expose the N⁻ substrate.

Figure 17A:
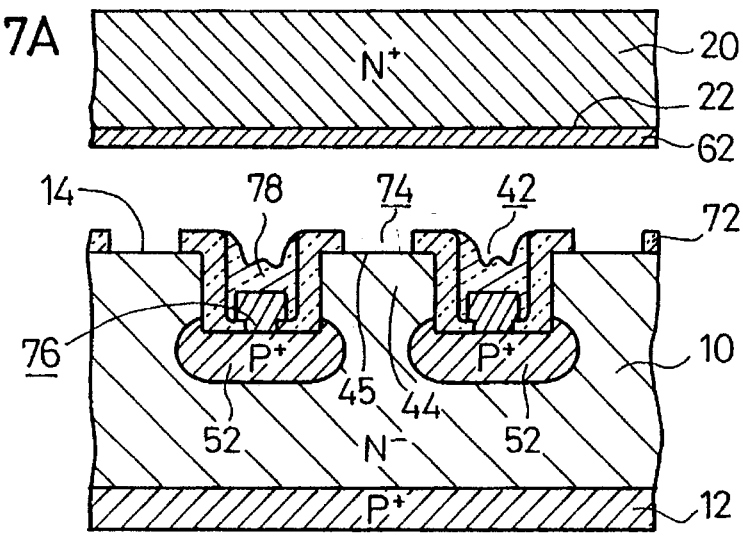
FIGS. 17A, 17B and 17C are cross-sectional views illustrating the static induction thyristor and the fabrication process thereof according to the eleventh embodiment of the present invention.

On the other hand, as illustrated in FIG. 17A, a metal layer 62 about 15 μm thick, which is composed of an Au-Sb alloy, is formed on the whole surface of the underside 22 of the N⁺ substrate 20 by a screen printing process.

The N⁻ substrate 10 and the N⁺ substrate 20 are then subjected to ultrasonic cleaning with an aqueous solution of sulfuric acid and hydrogen peroxide, thereby removing organic substances and metals from the substrates.

The N⁻ substrate 10 and the N⁺ substrate 20 are then washed with purified water and dried by a spin dryer at room temperature.

Figure 17B:
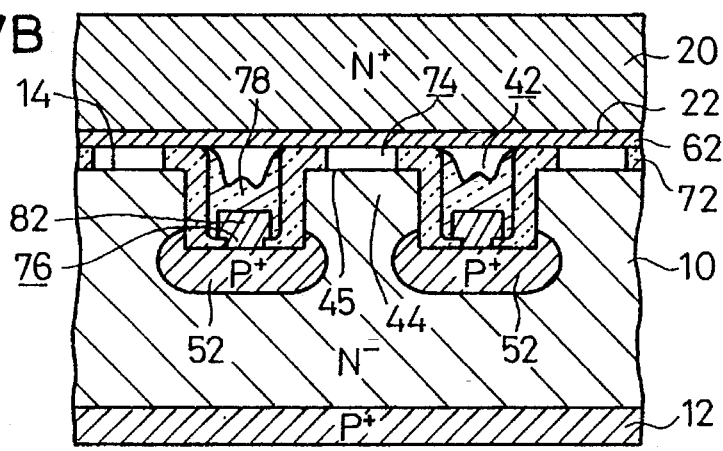
Figure 17C:
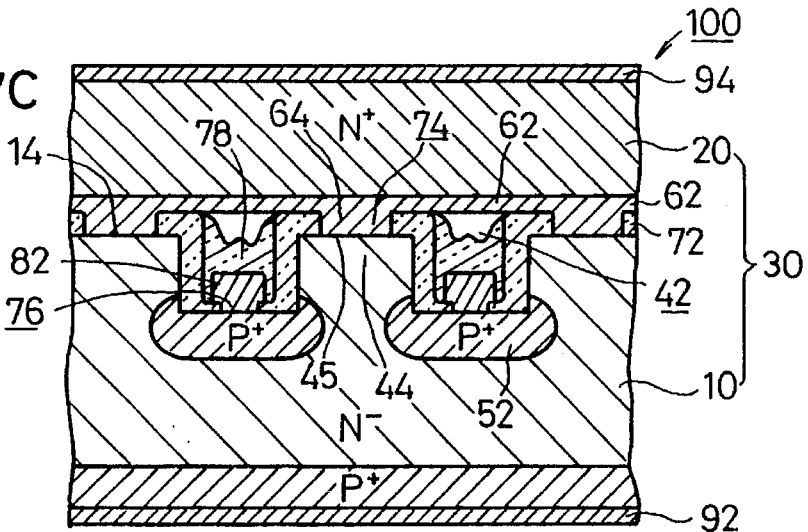

The N⁻ substrate 10 and the N⁺ substrate 20 are then heated at about 360° C. in a hydrogen atmosphere in a state that the oxide film 72 on the N⁻ substrate 10 has been brought into contact with the metal layer 62 provided on the underside 22 of the N⁺ substrate 20 as illustrated in FIG. 17B, whereby the N⁻ substrate 10 and the N⁺ substrate 20 are joined to each other as illustrated in FIG. 17C. Upon this junction under heat, a part of the metal layer 62 shifts into the openings 74 defined in the oxide film 72 to serve as a metal 64 in the openings 74. The N⁻ substrate 10 and the N⁺ substrate 20 are electrically connected to each other through this metal 64 and the metal layer 62.

An anode electrode 92 and a cathode electrode 94, which are composed of aluminum, are then formed on the underside of the P⁺ layer 12 formed on the underside of the N⁻ substrate 10 and the top of the N⁺ substrate 20, respectively.

In the static induction thyristor 100 thus fabricated, the P⁺ layer 12 functions as an anode, while the N⁺ substrate 20 functions not only as a cathode, but also as an N base 30 together with the N⁻ substrate 10. The P⁺-gate regions 52 function as a gate which controls an anode current flowing between the anode electrode 92 and the cathode electrode 94.

In this embodiment, the oxide film 78 is provided, as a protective film covering each of the gate electrodes 82, within the recess 42, whereby the top 14 of the N⁻ substrate 10 and the underside 22 of the N⁺ substrate 22 can be kept clean upon their junction. As a result, better junction can be achieved between the top 14 of the N⁻ substrate 10 and the underside 22 of the N⁺ substrate 22.

In this embodiment, also, the N base 30 in which the P⁺-gate regions 52 are buried is formed by the junction of the N⁻ substrate 10 and the N⁺ substrate 20. Therefore, the N base 30 can be provided as a crystalline base uniform and high in quality. The P⁺-gate regions 52 may also be made high in concentration, and the maximum cut-off current may hence be made higher. When the substrates 10 and 20 are joined to each other through the metal layer 62 formed of the Au-Sb alloy like this embodiment, the junction is feasible at about 350° C. or so, so that the substrates 10 and 20 can be joined uniformly to each other at a low temperature.

In this embodiment, the Au-Sb alloy is used for the metal layer 62. Since Au is good in wetting with Si, and Sb element is an n-type dopant, the impurity concentration at the junction surfaces can be made high to give better electrical junction.

(Twelfth embodiment)

FIGS. 18A to 18C and FIG. 19 are cross-sectional views illustrating a static induction thyristor and a fabrication process thereof according to the twelfth embodiment of the present invention.

In the eleventh embodiment described above, the tops 45 of the projections 44 of the N⁻ substrate 10 have been directly joined to the metal layer 62. The thyristor 100 according to this embodiment differs from the thyristor 100 of the eleventh embodiment in that N⁺ regions 16 are separately provided on the tops 45 of projections 44 of an N⁻ substrate 10, and the tops 45 of the projections 44 of the N⁻ substrate 10 are joined to the metal layer 62 through these N⁺ regions 16. However, other structures are the same as in the eleventh embodiment.

Figure 18A:
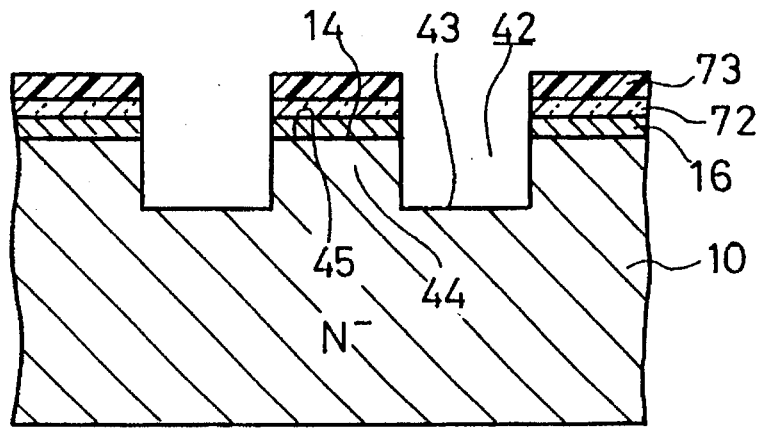
FIGS. 18A, 18B and 18C are cross-sectional views illustrating a static induction thyristor and a fabrication process thereof according to the twelfth embodiment of the present invention.
Figure 18B:
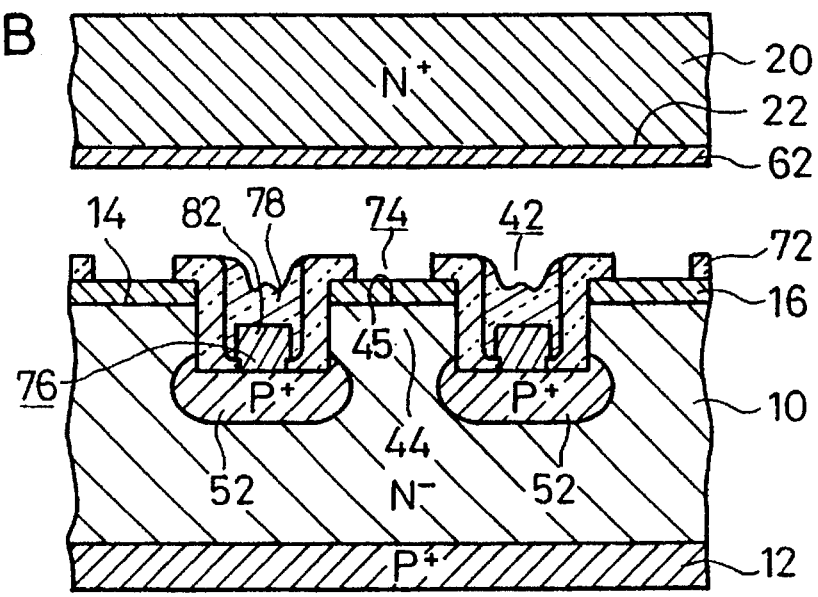
Figure 18C:
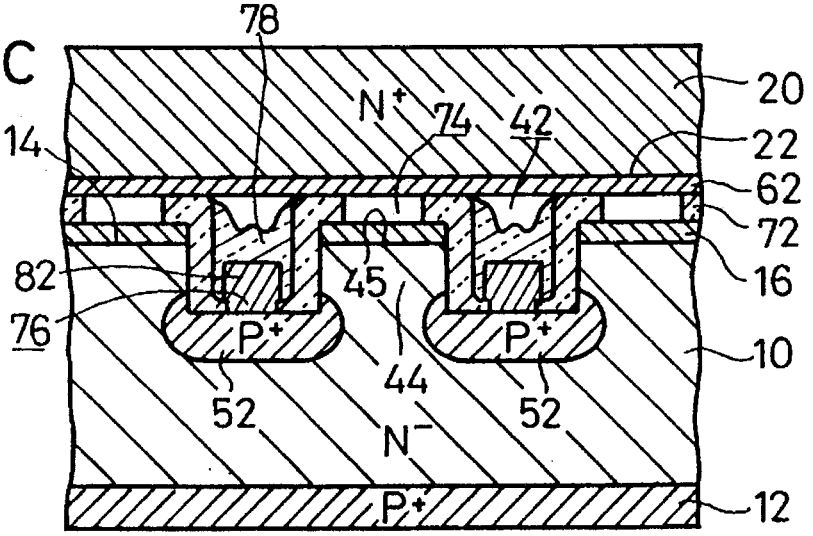

The fabrication process of this embodiment differs from that of the eleventh embodiment in that the N⁺ regions 16 are first formed on the top 14 of the N⁻ substrate 10, and the recesses 42 are then defined as illustrated in FIG. 18A. However, other respects are the same as in the fabrication process of the eleventh embodiment. According to the fabrication process of this embodiment, the static induction thyristor 100 illustrated in FIG. 19 can be provided.

The provision of the N⁺ regions 16 like this embodiment permits better electric connection.

According to the present invention, gate regions composed of a semiconductor having a conductive type different from that of the first semiconductor substrate are selectively formed in one principal surface of the first semiconductor substrate with portions of the one principal surface of the first semiconductor substrate exposed between the gate regions, a metal layer and/or a metal silicide layer is formed on at least one of the regions of one principal surface of the second semiconductor substrate, to which portions of the one principal surface of the first semiconductor substrate exposed between the gate regions are opposite, and portions of the one principal surface of the first semiconductor substrate exposed between the gate regions, and the one principal surface of the first semiconductor substrate is joined to the one principal surface of the second semiconductor substrate through the metal layer and/or the metal silicide layer. Therefore, a base in which the gate regions are provided is formed by the junction of the first semiconductor substrate and the second semiconductor substrate without performing epitaxial growth. The base can hence be provided as a crystalline base uniform and high in quality. Doping in the gate regions can also be performed at a high concentration. When the semiconductor substrates are joined to each other through the metal layer and/or the metal silicide layer in the above-described manner, the semiconductor substrates can be joined to each other at a low temperature.

When n-type semiconductor substrates, and an Au-Sb alloy are used at the first and second semiconductor substrates, and the metal, respectively, the impurity concentration at the junction surfaces can be made high to give better electrical junction because Au is good in wetting with Si, and Sb element is an n-type dopant.

When the metal layer and/or the metal silicide layer is formed on at least the regions of the one principal surface of the second semiconductor substrate, to which the portions of the one principal surface of the first semiconductor substrate exposed between the gate regions are opposite, it is possible to avoid the short circuit of the metal layer and/or the metal silicide layer to the gate regions formed in the first semiconductor substrate upon the formation of the metal layer and/or the metal silicide layer.

When the metal layer and/or the metal silicide layer is formed on the whole principal surface of the second semiconductor substrate, there is no need to conduct minute processing upon the formation of the metal layer and/or the metal silicide layer, and so the production process is simplified.

A plurality of recesses are defined in the one principal surface of the first semiconductor substrate in such a manner that the one principal surface of the first semiconductor substrate is partly exposed between the recesses, and the gate regions are separately provided in at least the regions exposed on sides of the recesses defined in the first semiconductor substrate, whereby the length in the direction of an anode current of a depletion layer extending from the gate region in an off state can be enlarged, and so a channel width can be enlarged. Therefore, a semiconductor device, by which withstanding voltage in an off-state can be made high, a leakage current can also be lessened, and a high current can be controlled owing to its excellent cut-off capacity, can be fabricated.

Each of the gate regions is provided in a region exposed on the bottom of the recess, whereby this gate region can be easily connected to a gate electrode if the gate electrode is provided in the recess.

An insulating film covering each of the gate regions is provided, whereby it is possible to avoid the short circuit of the gate regions to the cathode due to the shifting of the metal layer and/or the metal silicide layer upon the junction of the first semiconductor substrate to the second semiconductor substrate. As a result, reduction in withstanding voltage can be avoided.

A semiconductor region, which has the same conductive type as that of the first semiconductor substrate and is higher in impurity concentration than the first semiconductor substrate, is provided on the one principal surface of the first semiconductor substrate, whereby better electric connection can be achieved.

A conductive gate electrode electrically connected to the gate region is provided within the recess, whereby the resistance of the gate in a lateral direction can be reduced, and so a maximum cut-off current can be heightened, and moreover the drawing current of a carrier can be increased, so that switching operation can be conducted at higher speed.

Since each of the gate electrodes has been already provided within the recess in the first semiconductor substrate before the junction of the one principal surface of the first semiconductor substrate to the one principal surface of the second semiconductor substrate, there is no need to cut grooves high in aspect ratio in the second semiconductor substrate from the outside to form the gate electrodes within the grooves even when such gate electrodes are provided. As a result, the second semiconductor substrate is prevented from being finely divided by the grooves at portions over the gate electrodes to increase its resistance.

Further, since the recesses provided in the one principal surface of the first semiconductor substrate are required only to have a size sufficient to contain the gate electrode therein, the formation of the recesses does not take very long even when the recesses are formed by a dry etching process low in etching speed.

Furthermore, since the gate electrodes are each provided within the recess defined in the one principal surface of the first semiconductor substrate, the second semiconductor substrate to be joined to the one principal surface of the first semiconductor substrate is not required to define any recess in the one principal surface thereof. Therefore, such a principal surface may be flat, which makes the fabrication of the thyristor easy.

A protective film covering each of the gate electrodes is provided within the recess, whereby the one principal surface of the first semiconductor substrate and the one principal surface of the second semiconductor substrate can be kept clean upon their junction. As a result, better junction can be achieved between the one principal surface of the first semiconductor substrate and the one principal surface of the second semiconductor substrate.

The second semiconductor substrate is brought to a substrate higher in impurity concentration than the first semiconductor substrate, whereby better ohmic contact can be achieved.

In the semiconductor device according to the present invention, wherein a gate for controlling a current flowing between an anode and a cathode is provided in a base within a semiconductor substrate provided between the anode and the cathode, the base is formed by the junction of two semiconductors of the same conductive type, and their junction is performed through a metal layer and/or a metal silicide layer, whereby the base can be provided as a crystalline base uniform and high in quality. Doping in gate regions can also be performed at a high concentration.

Cavities are provided within the base, a gate region is provided in the base at an exposed bottom and/or side area of each cavity, a protective film covering the gate region is provided within the cavity, and openings are defined in another protective film covering the surface of one of the semiconductors to perform the junction through the metal layer and/or the metal silicide layer shifted into the openings, whereby the one principal surface of the first semiconductor substrate is surely caused to electrically communicate with one principal surface of the second semiconductor substrate, and moreover it is possible to avoid the short circuit of the gate regions to a cathode due to the shifting of the metal layer and/or the metal silicide layer upon the junction of the first semiconductor substrate to the second semiconductor substrate. As a result, reduction in withstanding voltage can be avoided.

A semiconductor region, which has the same conductive type as that of the base and is higher in impurity concentration than the base, is provided in a region of the base coming into contact with the metal layer and/or the metal silicide layer, whereby better electric connection can be achieved.

A conductive gate electrode electrically connected to the gate region is provided within the cavity, whereby the resistance of the gate in a lateral direction can be reduced, and so a maximum cut-off current can be heightened, and moreover the drawing current of a carrier can be increased, so that switching operation can be conducted at higher speed.

A protective film covering the gate electrode is provided within the cavity, whereby the junction surfaces of the two semiconductors can be kept clean upon their junction. As a result, better junction can be achieved between the two semiconductors.

When the semiconductor layer between the cathode and the metal layer and/or the metal silicide layer is formed as a semiconductor region high in impurity concentration, it is possible to achieve specific effects so that this region serves as an emitter layer, and so the resistance becomes low and power loss hence lessens.

What is claimed is:

1. In a semiconductor device including an anode, a cathode, a semiconductor substrate provided between the anode and the cathode, a base within the semiconductor substrate and a gate provided in the base for controlling a current flowing between the anode and the cathode, the improvement wherein the base is formed by the junction of two semiconductors of the same conductive type, and the junction thereof is performed through a metal layer and/or a metal silicide layer.

2. The semiconductor device according to claim 1, wherein cavities are provided within the base, a gate region is provided in the base at an exposed bottom and/or side area of each of the cavities, a protective film covering the gate region is provided within the cavity, and openings are defined in another protective film covering the surface of one of the semiconductors to perform the junction through the metal layer and/or the metal silicide layer shifted into the openings.

3. The semiconductor device according to claim 1, wherein a semiconductor region, which has the same conductive type as that of the base and is higher in impurity concentration than the base, is provided in a region of the base coming into contact with the metal layer and/or the metal silicide layer.

4. The semiconductor device according to claim 2, wherein a conductive gate electrode electrically connected to the gate region is provided within the cavity.

5. The semiconductor device according to claim 4, wherein a protective film covering the gate electrode is provided within the cavity.

6. The semiconductor device according to claim 1, wherein the semiconductor substrate includes the first semiconductor layer of one conductive type and the base of the other conductive type provided on the first semiconductor layer, one of the anode and the cathode is provided on the first semiconductor layer so as to electrically connect to each other, the other of the anode and the cathode is provided on a semiconductor region of the other conductive type, which is formed on the base and higher in impurity concentration than the base, so as to electrically connect to each other, and the gate region is composed of a semiconductor of said one conductive type.

7. The semiconductor device according to claim 1, wherein a semiconductor layer between the cathode and the metal layer and/or the metal silicide layer is formed as a semiconductor region high in impurity concentration.

* * * * *